(12) United States Patent
Sun

(10) Patent No.: US 10,811,597 B2
(45) Date of Patent: Oct. 20, 2020

(54) MAGNETORESISTIVE STACK/STRUCTURE AND METHODS THEREFOR

(71) Applicant: Everspin Technologies, Inc., Chandler, AZ (US)

(72) Inventor: Jijun Sun, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/411,194

(22) Filed: May 14, 2019

(65) Prior Publication Data

US 2019/0355897 A1    Nov. 21, 2019

Related U.S. Application Data

(60) Provisional application No. 62/671,794, filed on May 15, 2018.

(51) Int. Cl.
| | | |
|---|---|---|
| *H01L 27/22* | (2006.01) | |
| *H01L 43/02* | (2006.01) | |
| *H01L 43/10* | (2006.01) | |
| *H01F 10/32* | (2006.01) | |
| *H01F 41/30* | (2006.01) | |
| *G11C 11/16* | (2006.01) | |
| *H01L 43/12* | (2006.01) | |

(52) U.S. Cl.
CPC ............ *H01L 43/02* (2013.01); *G11C 11/161* (2013.01); *H01F 10/3268* (2013.01); *H01F 41/303* (2013.01); *H01L 27/228* (2013.01); *H01L 43/10* (2013.01); *H01L 43/12* (2013.01); *H01F 10/3286* (2013.01)

(58) Field of Classification Search
CPC ....... H01L 43/02; H01L 27/228; H01L 43/08; H01L 43/10; H01L 43/12; G11C 11/161
USPC ......................................................... 257/421
See application file for complete search history.

(56) References Cited

U.S. PATENT DOCUMENTS

| | | | |
|---|---|---|---|
| 8,686,484 B2 | 4/2014 | Whig et al. | |
| 8,747,680 B1 | 6/2014 | Deshpande et al. | |
| 9,023,216 B2 | 5/2015 | Kochergin et al. | |
| 9,136,464 B1 | 9/2015 | Whig et al. | |
| 9,419,208 B2 | 8/2016 | Whig et al. | |
| 10,141,498 B2 * | 11/2018 | Whig | ...................... H01L 43/02 |

* cited by examiner

*Primary Examiner* — Hrayr A Sayadian
(74) *Attorney, Agent, or Firm* — Bookoff McAndrews, PLLC

(57) ABSTRACT

A magnetoresistive device with a magnetically fixed region having at least two ferromagnetic regions coupled together by an antiferromagnetic coupling region. At least one of the two ferromagnetic regions includes multiple alternating metal layers and magnetic layers and one or more interfacial layers. Wherein, each metal layer includes at least one of platinum, palladium, nickel, or gold, and the interfacial layers include at least one of an oxide, iron, or an alloy including cobalt and iron.

20 Claims, 21 Drawing Sheets

MAGNETORESISTIVE STACK/STRUCTURE AND METHODS THEREFOR

CROSS-REFERENCE TO RELATED APPLICATIONS

This application claims the benefit of priority from U.S. Provisional Application No. 62/671,794, filed on May 15, 2018, which is incorporated by reference herein in its entirety.

TECHNICAL FIELD

The present disclosure relates to, among other things, embodiments and aspects of magnetoresistive stacks/structures and methods therefor, including methods of use and methods of manufacturing the disclosed magnetoresistive stacks/structures.

INTRODUCTION

There are many inventions described and illustrated herein, as well as many aspects and embodiments of those inventions. In one aspect, the present disclosure relates to a magnetoresistive stack/structure (for example, a magnetoresistive memory stack/structure or a magnetoresistive sensor/transducer stack/structure) and methods of manufacturing such a stack/structure. In one embodiment, the disclosed magnetoresistive stack/structure is implemented in an MTJ (magnetic tunnel junction)-type magnetoresistive stack/structure having a perpendicular magnetic anisotropy, wherein the fixed magnetic region maintains or includes improved properties (for example, magnetoresistance (MR), resistance-area product (RA), and delta RA of the stack/structure) after subsequent or additional processing. Notably, the embodiments described herein may employ any technique now known or later developed to manufacture the MTJ stack/structure; all such techniques are intended to fall within the scope of the present disclosure. In one embodiment, the described MTJ stack/structure may be implemented as a magnetoresistive memory stack/structure.

Briefly, a magnetoresistive memory stack/structure, in one embodiment, includes at least one non-magnetic layer (for example, at least one dielectric layer or at least one electrically conductive layer) disposed between a "fixed" magnetic region and a "free" magnetic region, each including a plurality of layers of one or more magnetic or ferromagnetic materials. Information is stored in the magnetoresistive memory stack/structure by switching, programming, and/or controlling the direction of magnetization vectors in one or more of the magnetic layers of the "free" magnetic region of the stack/structure. Here, the direction of the magnetization vectors of the "free" magnetic region may be switched and/or programmed (for example, through spin transfer torque or spin orbit torque) by application of a write signal (e.g., one or more current pulses) to or through the magnetoresistive memory stack/structure while, in contrast, the magnetization vectors in the magnetic layers of a "fixed" magnetic region are magnetically fixed (e.g., in a predetermined direction).

The magnetoresistive memory stack/structure includes an electrical resistance that depends on the magnetic state of certain regions of the memory stack/structure. That is, when the magnetization vectors of the "free" magnetic region are in a first state or in a first direction (for example, which is the same direction as the direction of the magnetization vectors of the "fixed" magnetic region), the magnetoresistive memory stack/structure has a first magnetic state, which may correspond to a low electrical resistance state. Conversely, when the magnetization vectors of the "free" magnetic region are in a second state or in a second direction (for example, which is a different direction (for example, opposite or opposing) as the direction of the magnetization vectors of the "fixed" magnetic region), the magnetoresistive memory stack/structure has a second magnetic state, which may correspond to a high electrical resistance state. The magnetic state of the magnetoresistive memory stack/structure is determined or read based on the resistance of the stack/structure in response to a read current of a read operation.

It should be noted that, although exemplary embodiments are described and/or illustrated herein in the context of MTJ stacks/structures, the present inventions may also be implemented in giant magnetoresistive (GMR) stacks/structures where a conductor (e.g., copper) is disposed between two ferromagnetic regions/layers/materials. Indeed, the present inventions may be employed in connection with other types of magnetoresistive stacks/structures wherein such stacks/structures include a fixed magnetic region. For the sake of brevity, the discussions and illustrations will not be repeated specifically in the context of GMR or other magnetoresistive stacks/structures—but such discussions and illustrations are to be interpreted as being entirely applicable to GMR and other stacks/structures.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

For simplicity and clarity of illustration, the figures depict the general structure and/or manner of construction of the various embodiments. For ease of illustration, the figures depict the different layers/regions of the illustrated stacks as having a uniform thickness and well defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s). Further, even though the figures and this written disclosure appear to describe the disclose magnetoresistive stack/structures in a particular order of construction (e.g., from bottom to top), it is understood that the depicted magnetoresistive stack/structures may have the opposite order (e.g., from top to bottom). For example, a "fixed" magnetic region may be formed on or above a "free" magnetic region or layer, which in turn may be formed on or above an insertion layer of the present disclosure.

Figure 1:
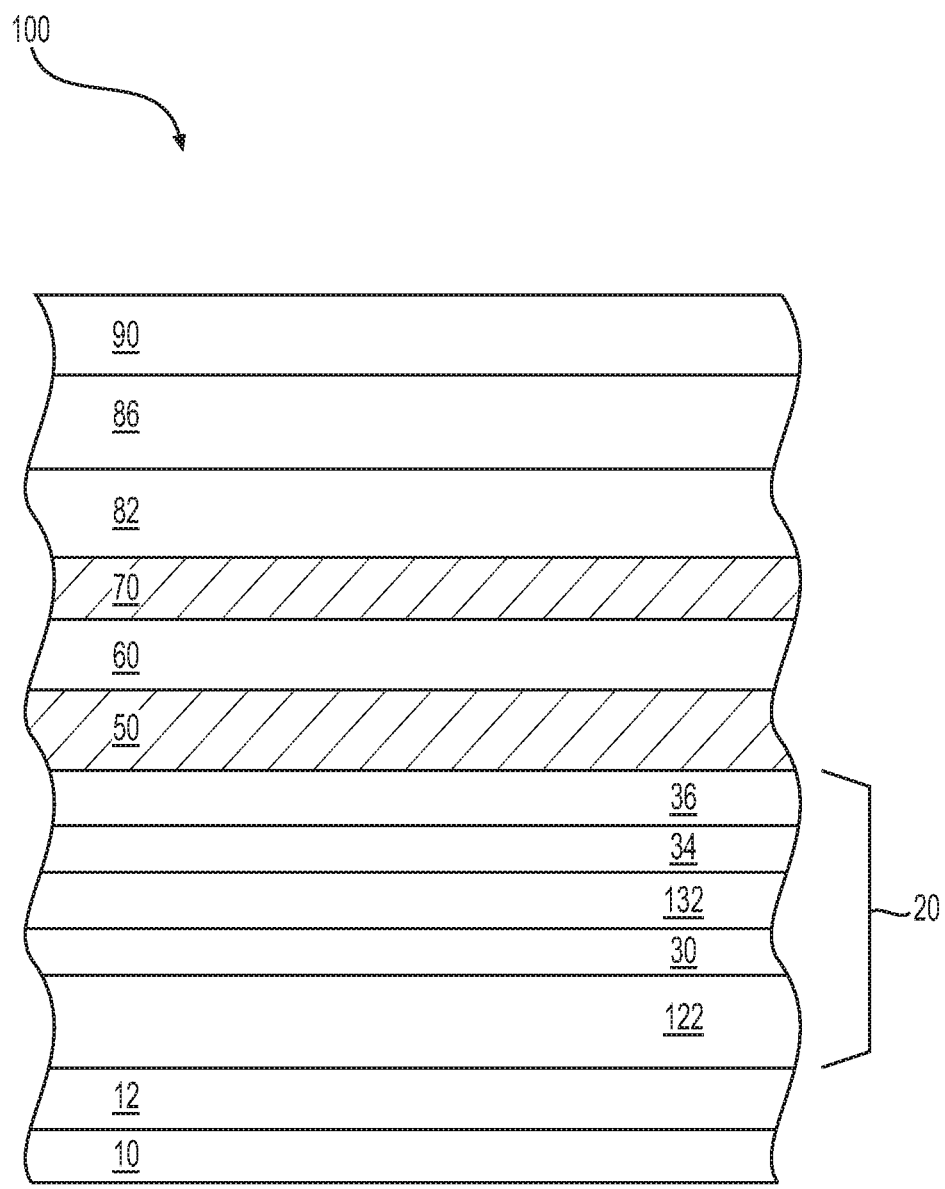
Figure 2:
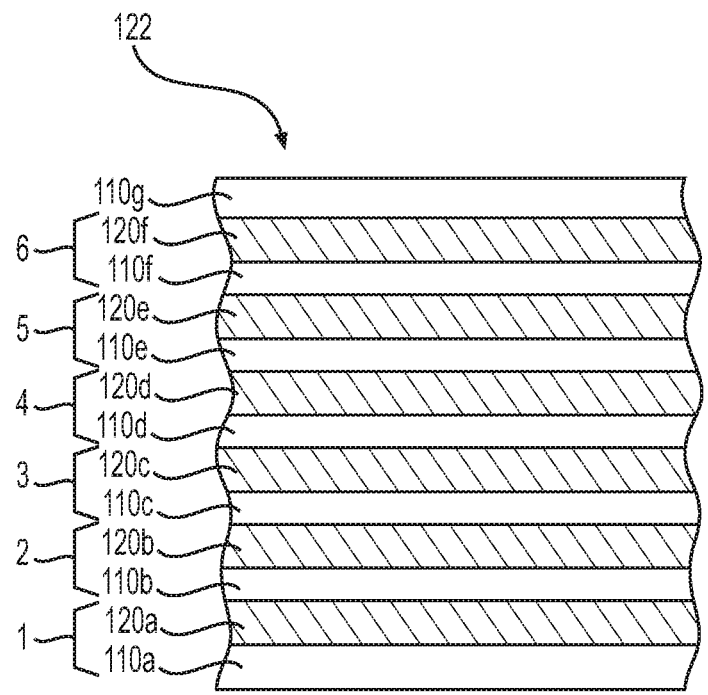
Figure 3:
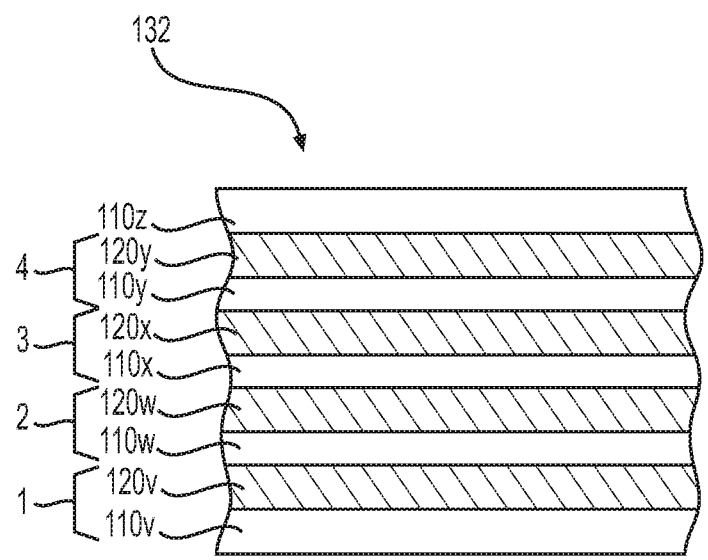
Figure 4:
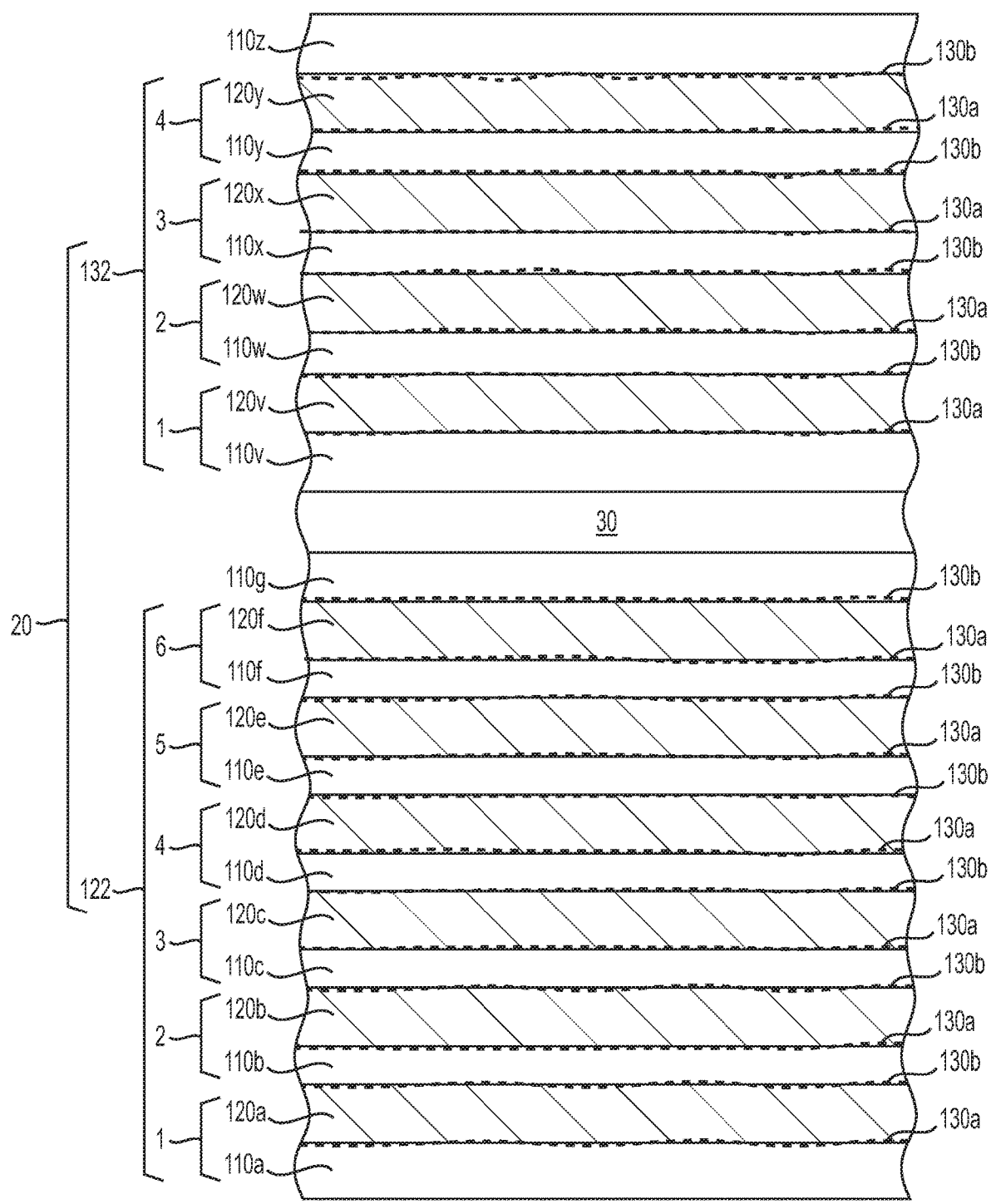
Figure 5:
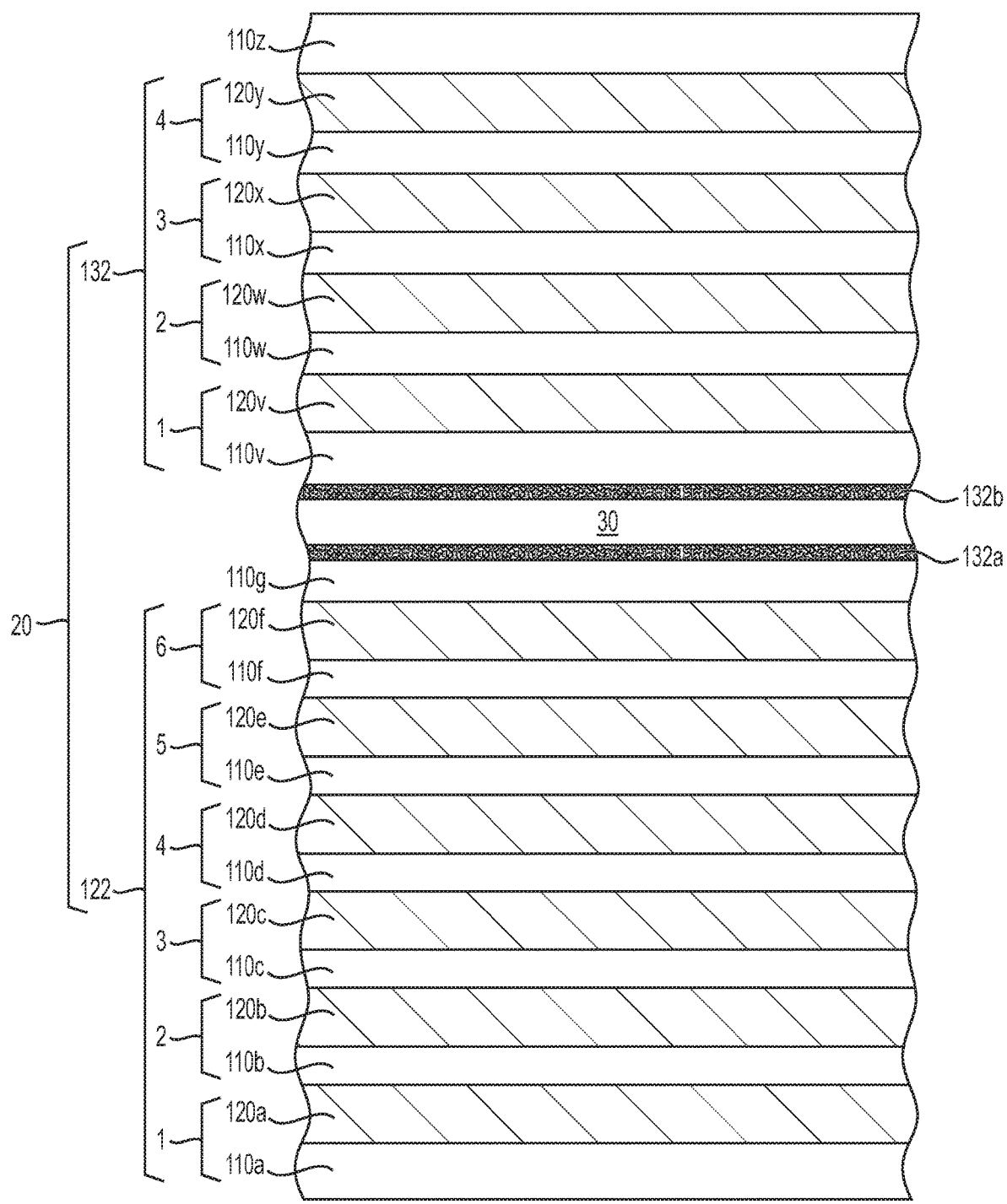
Figure 7:
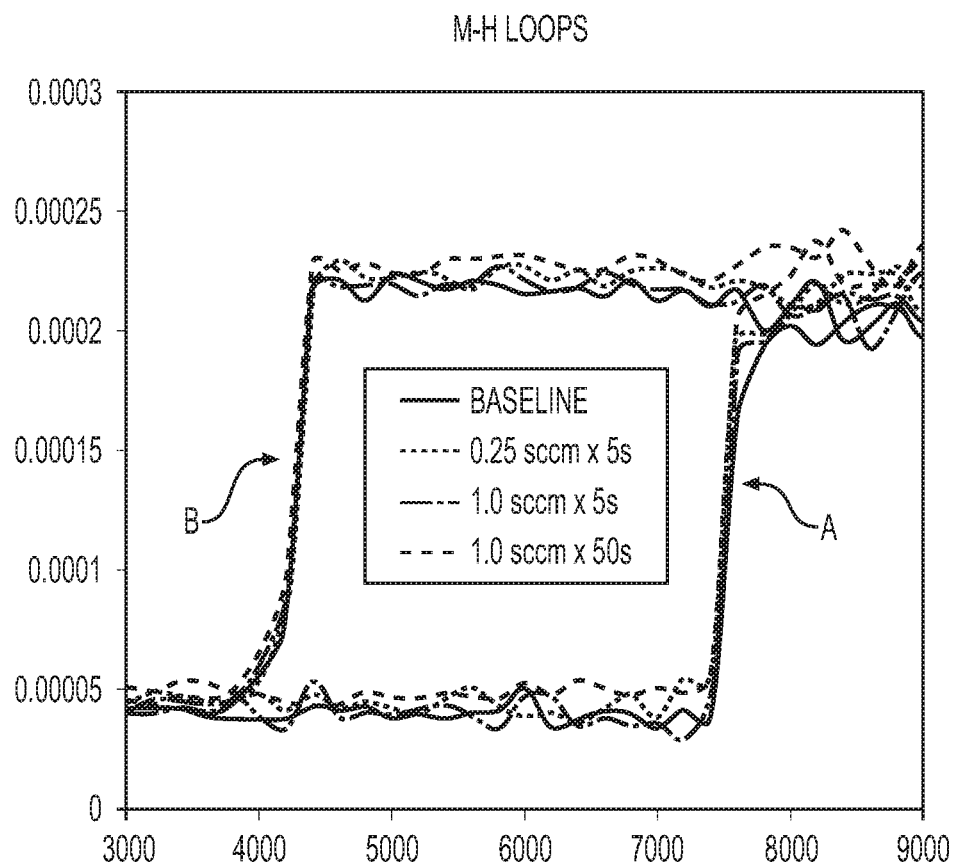
Figure 8A:
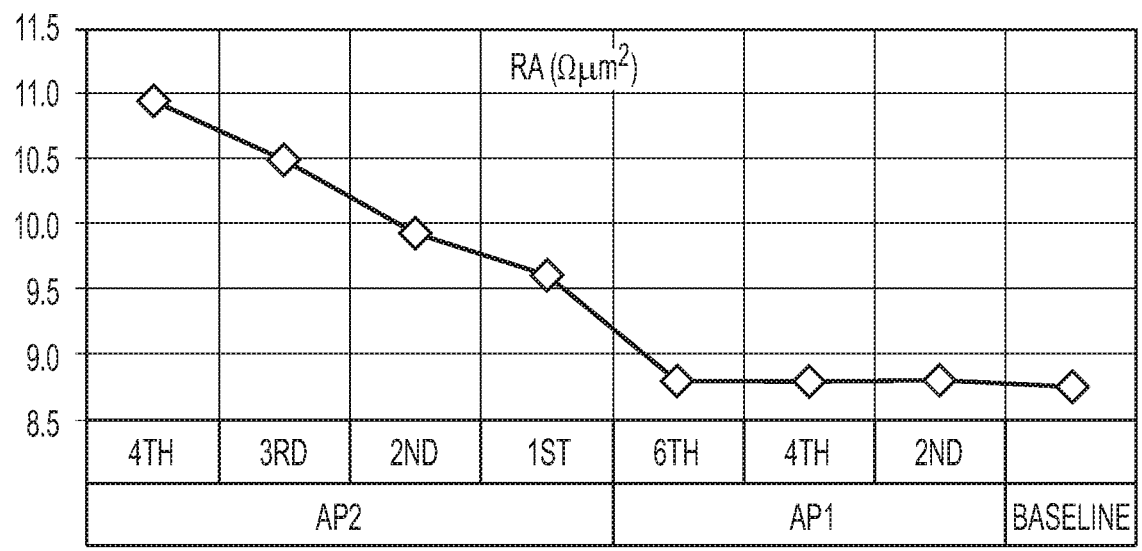
Figure 8B:
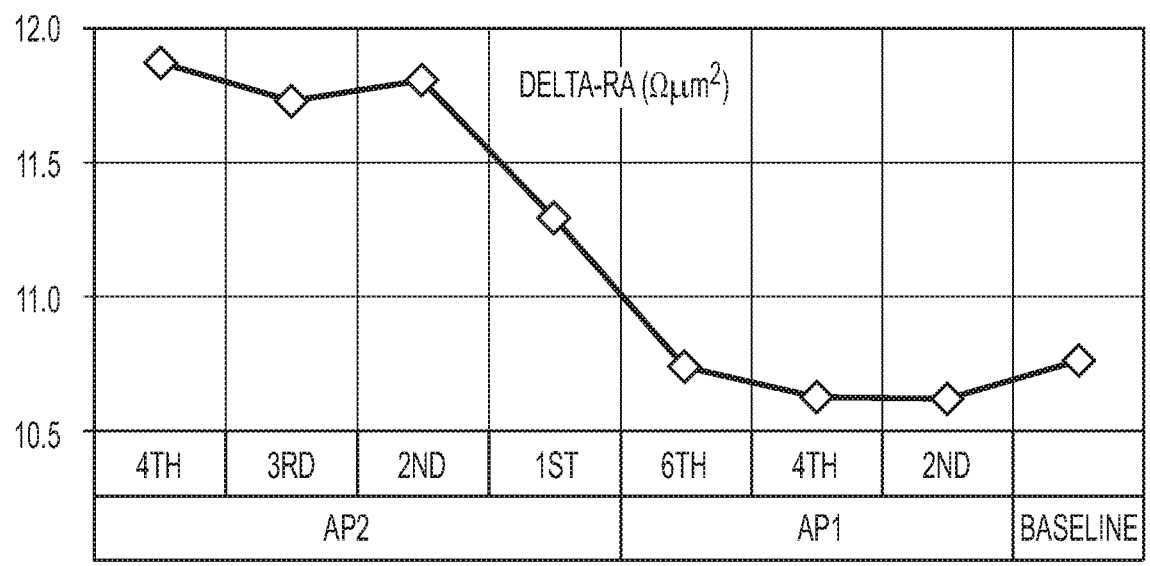
Figure 8C:
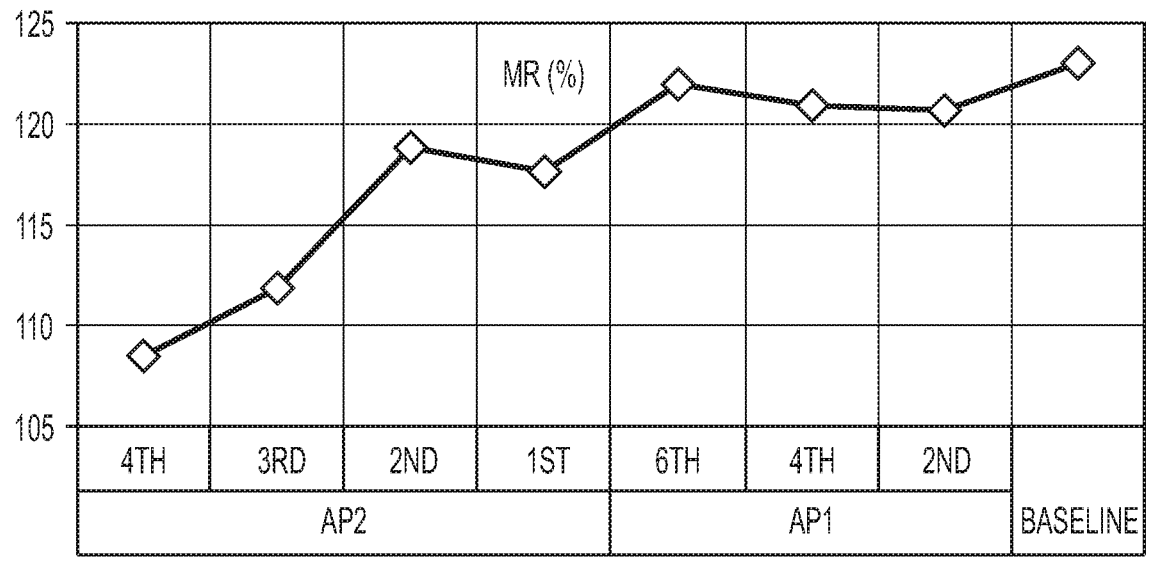
Figure 9A:
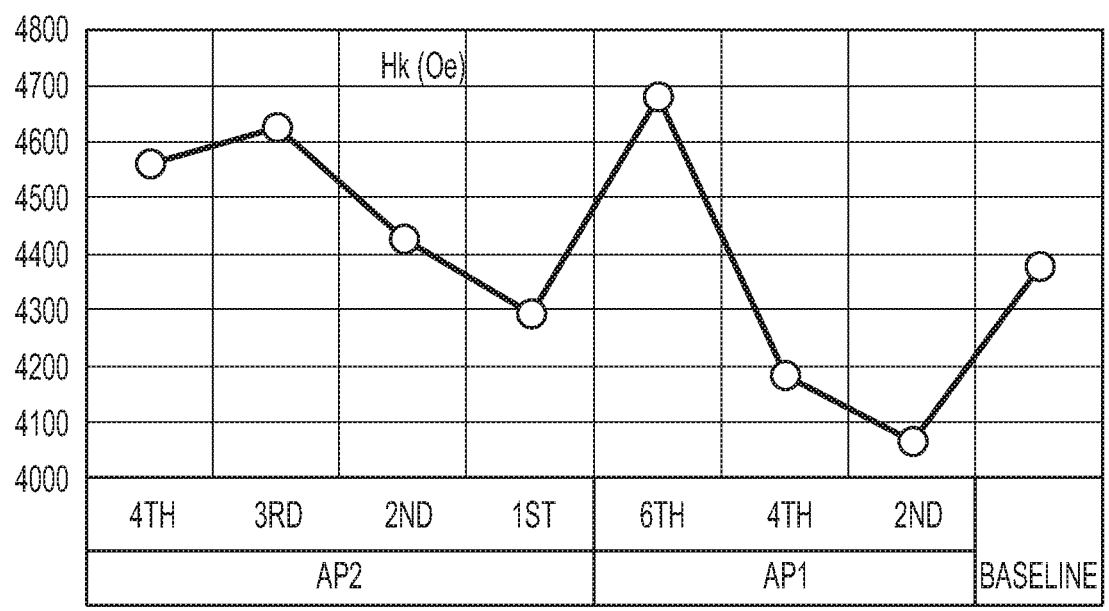
Figure 9B:
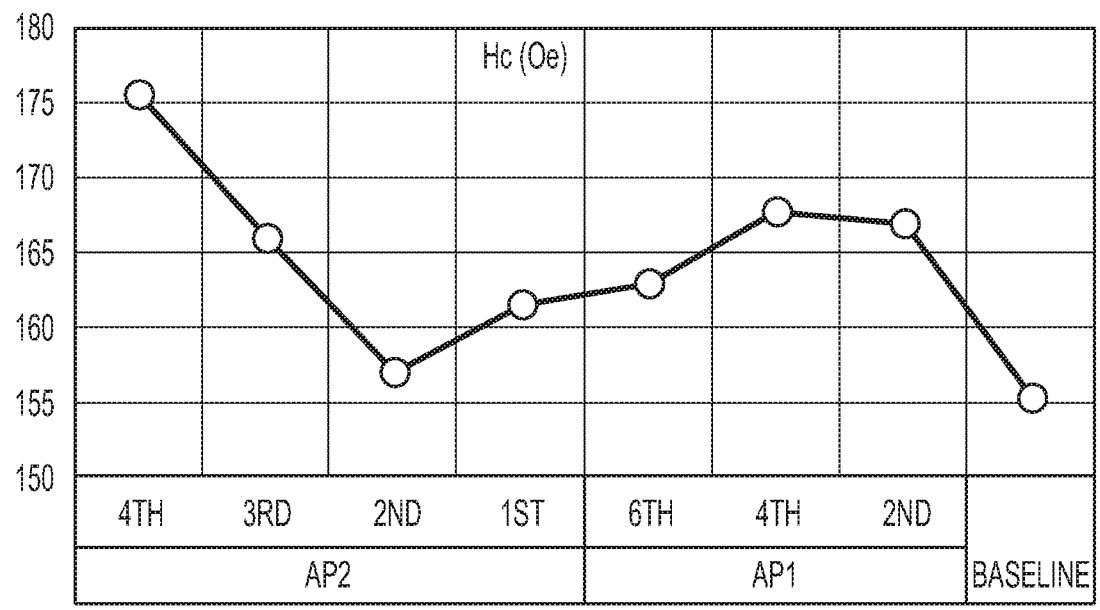
Figure 9C:
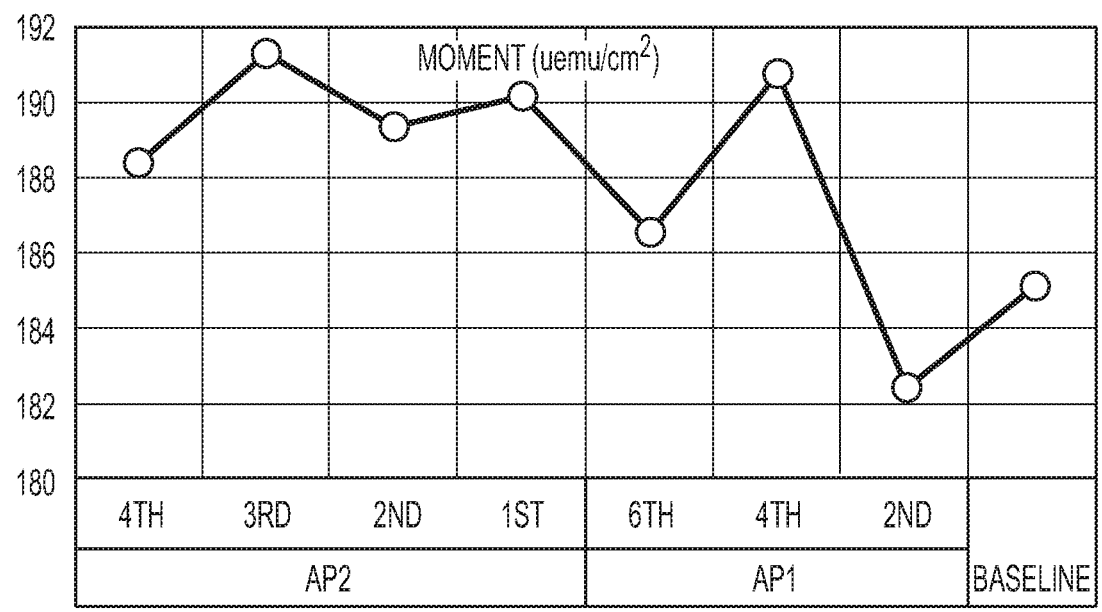
Figure 9D:
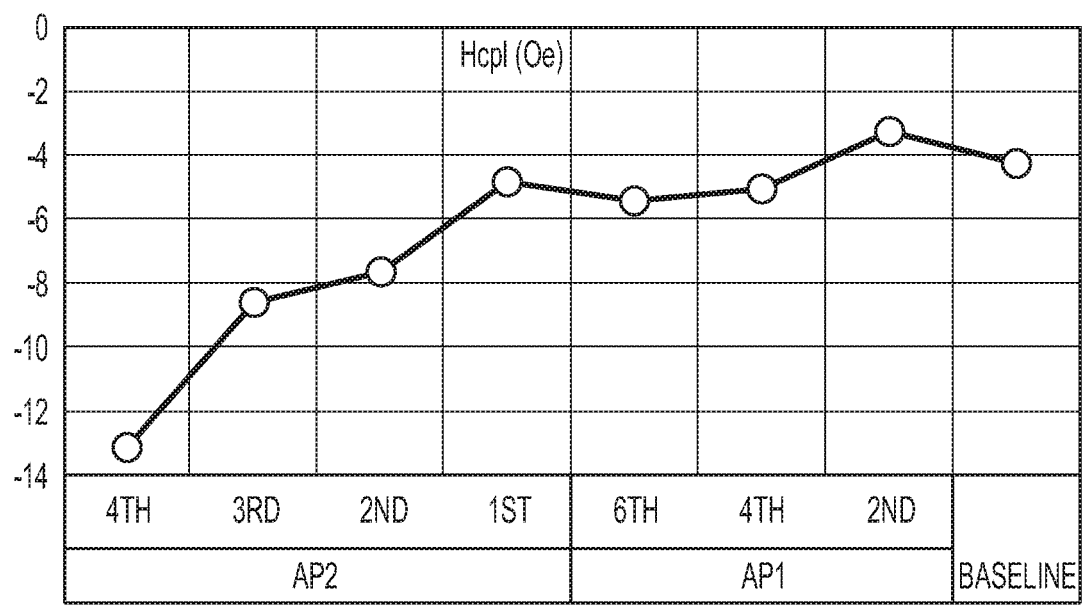
Figure 10A:
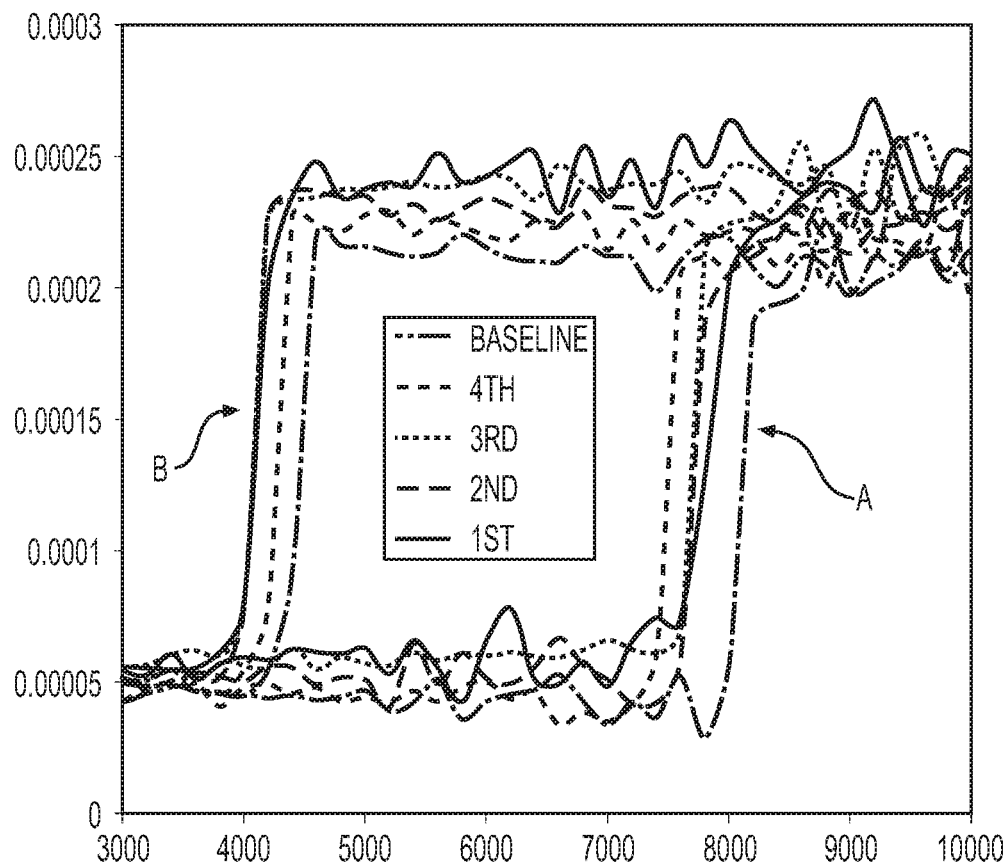
Figure 10B:
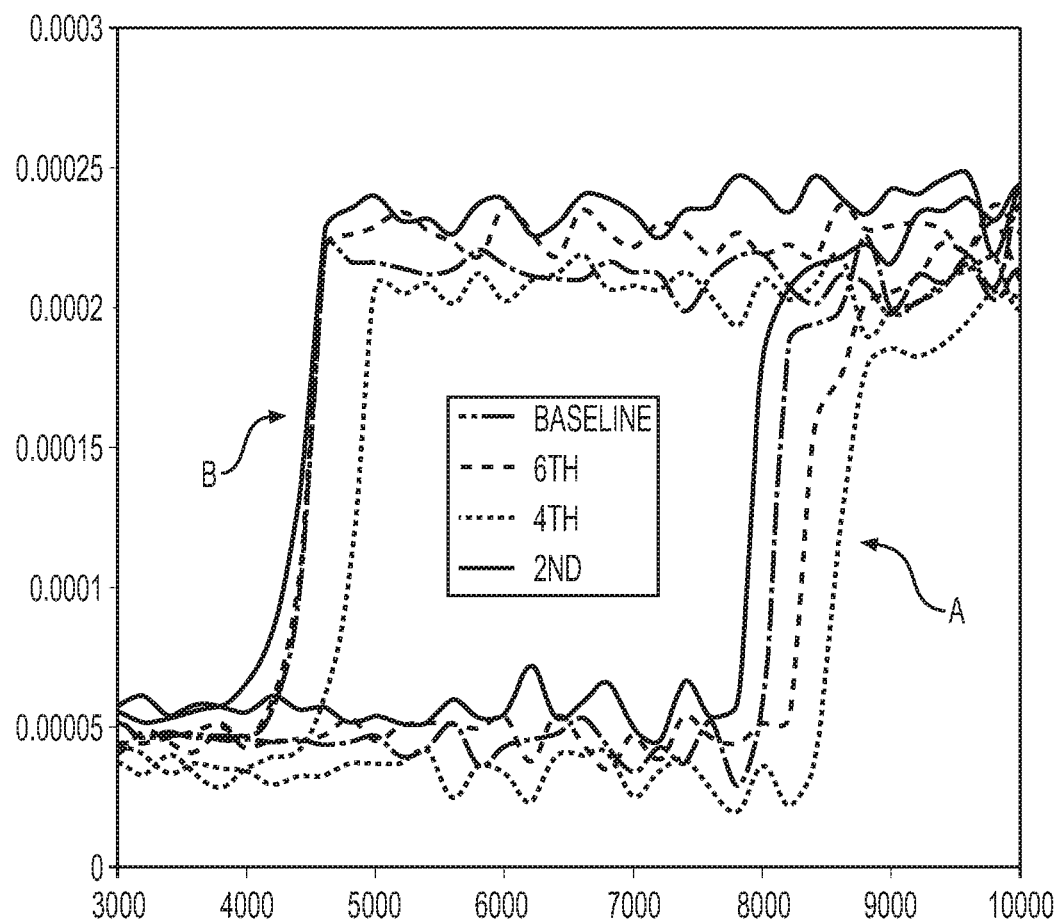
Figure 12A:
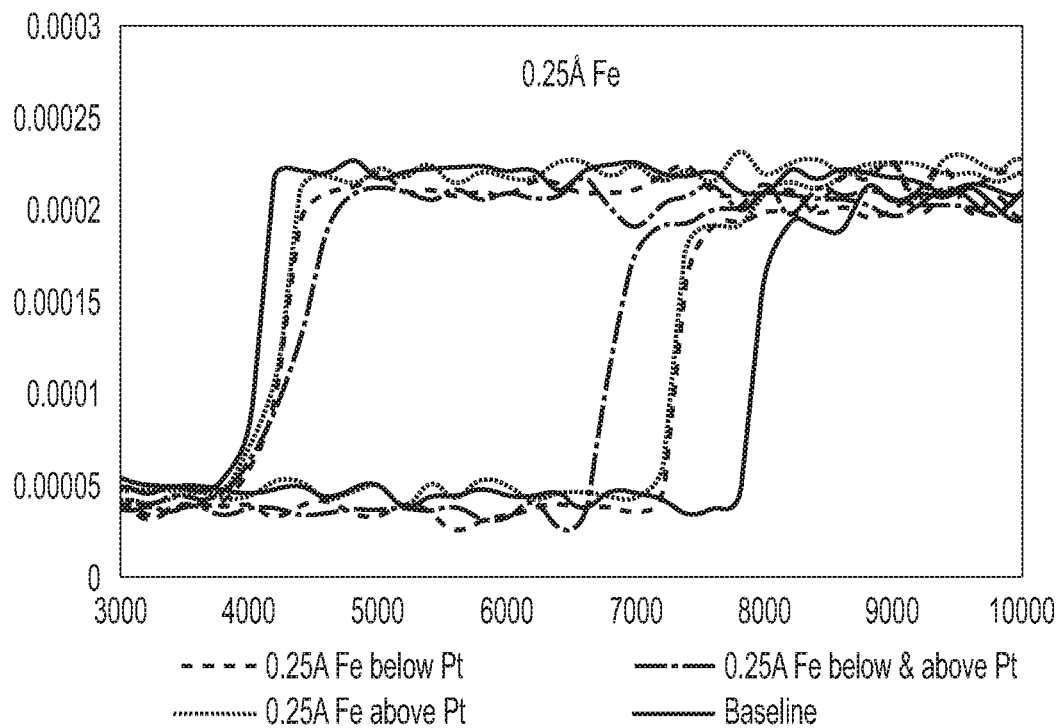
Figure 12B:
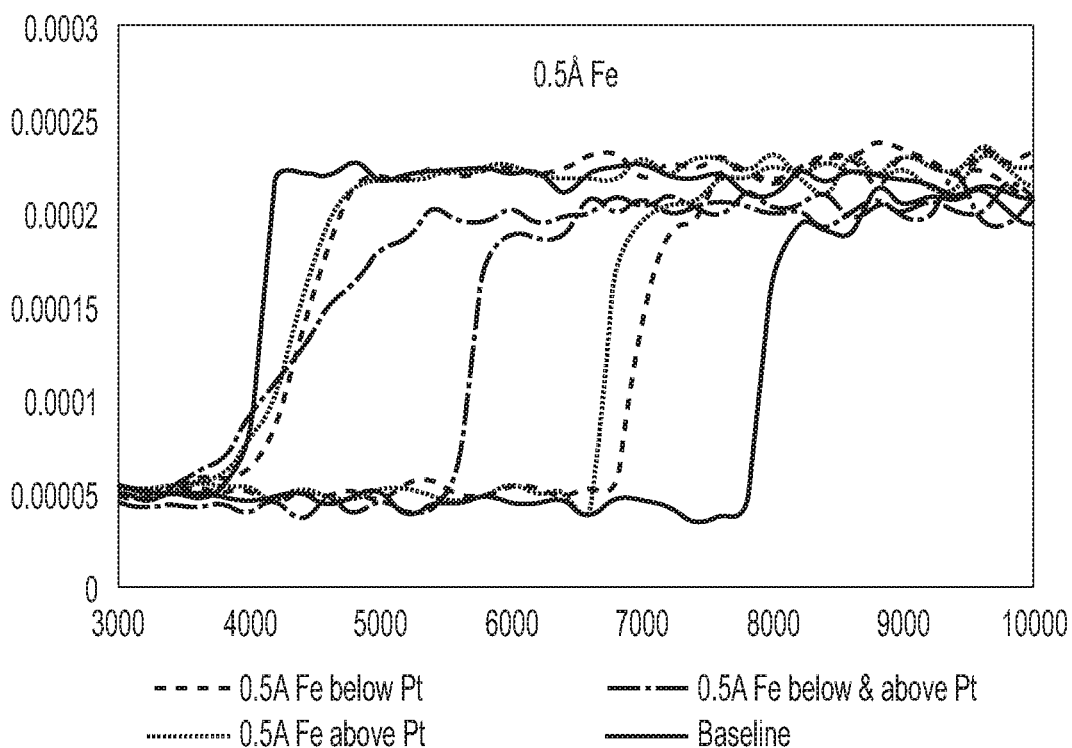
Figure 12C:
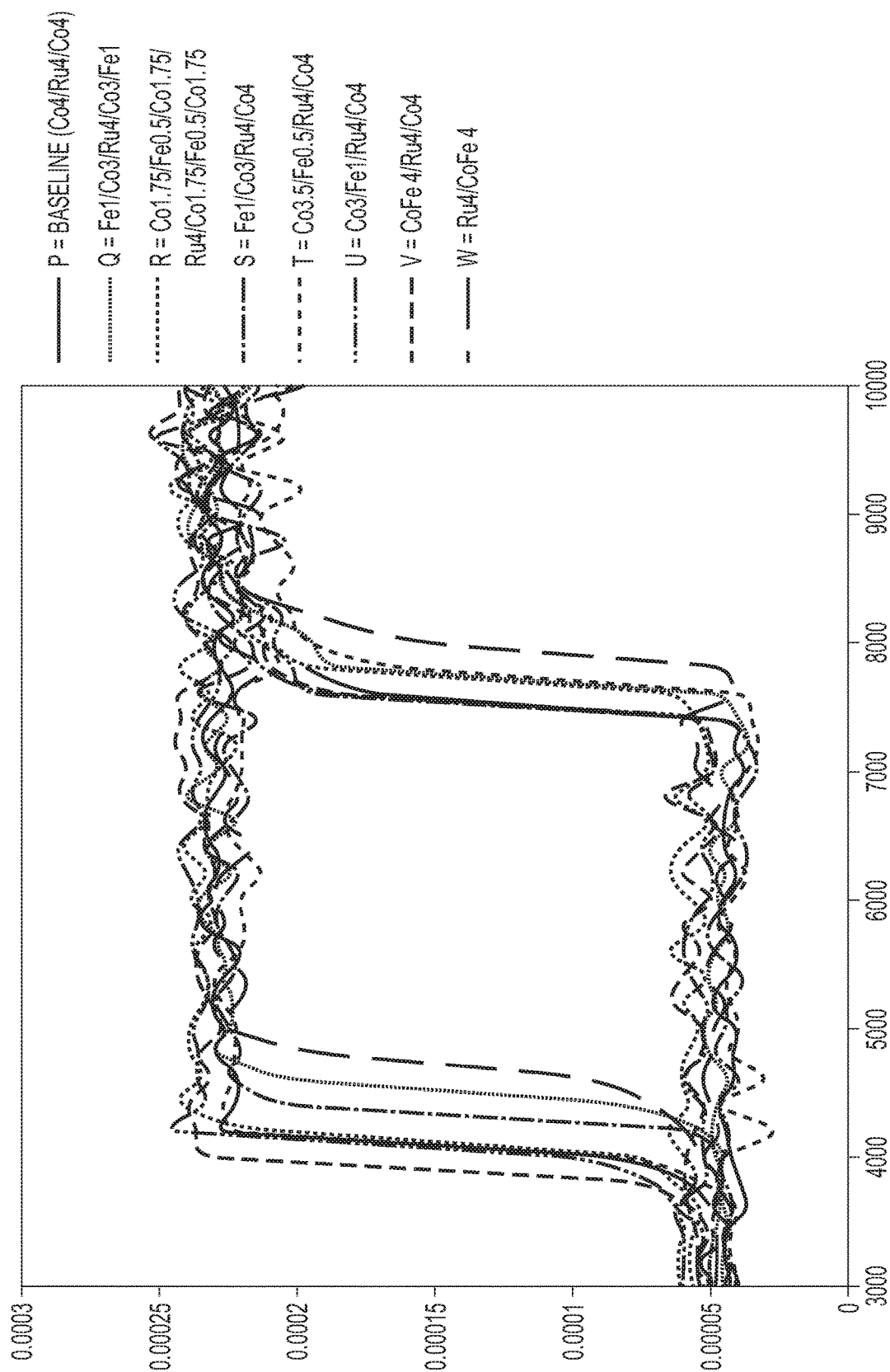
Figure 14A:
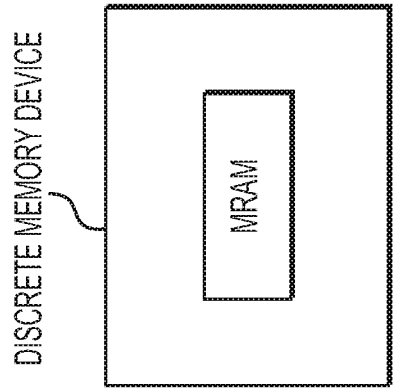
Figure 14B:
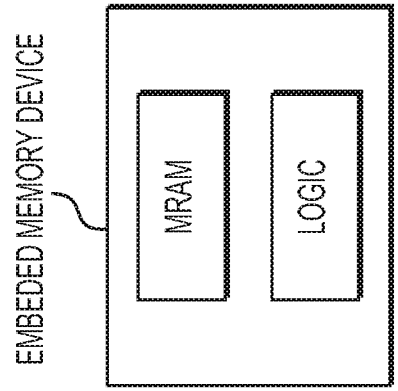
Figure 13:
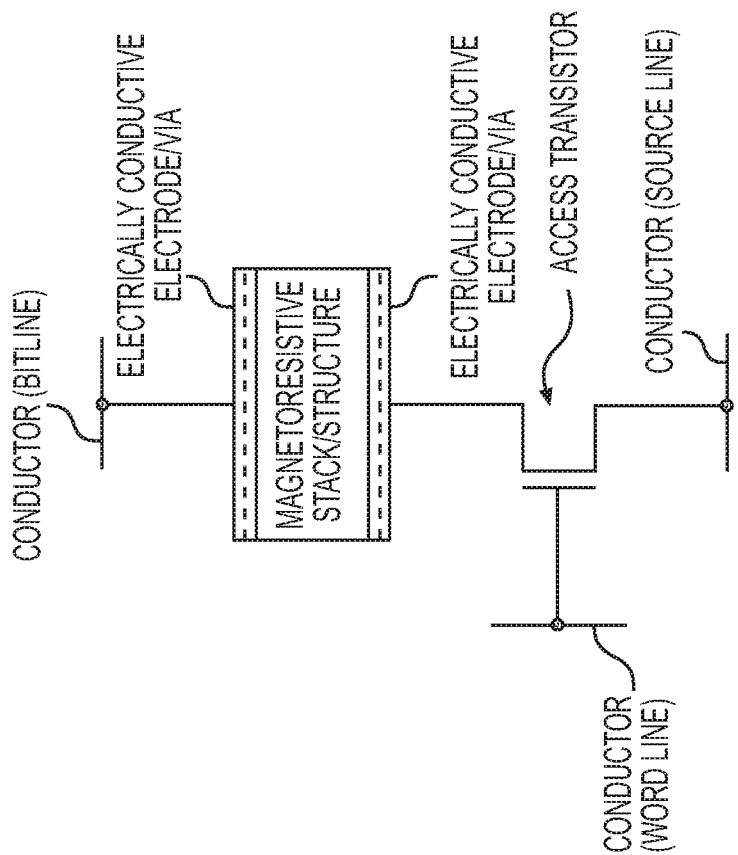
Figure 15:
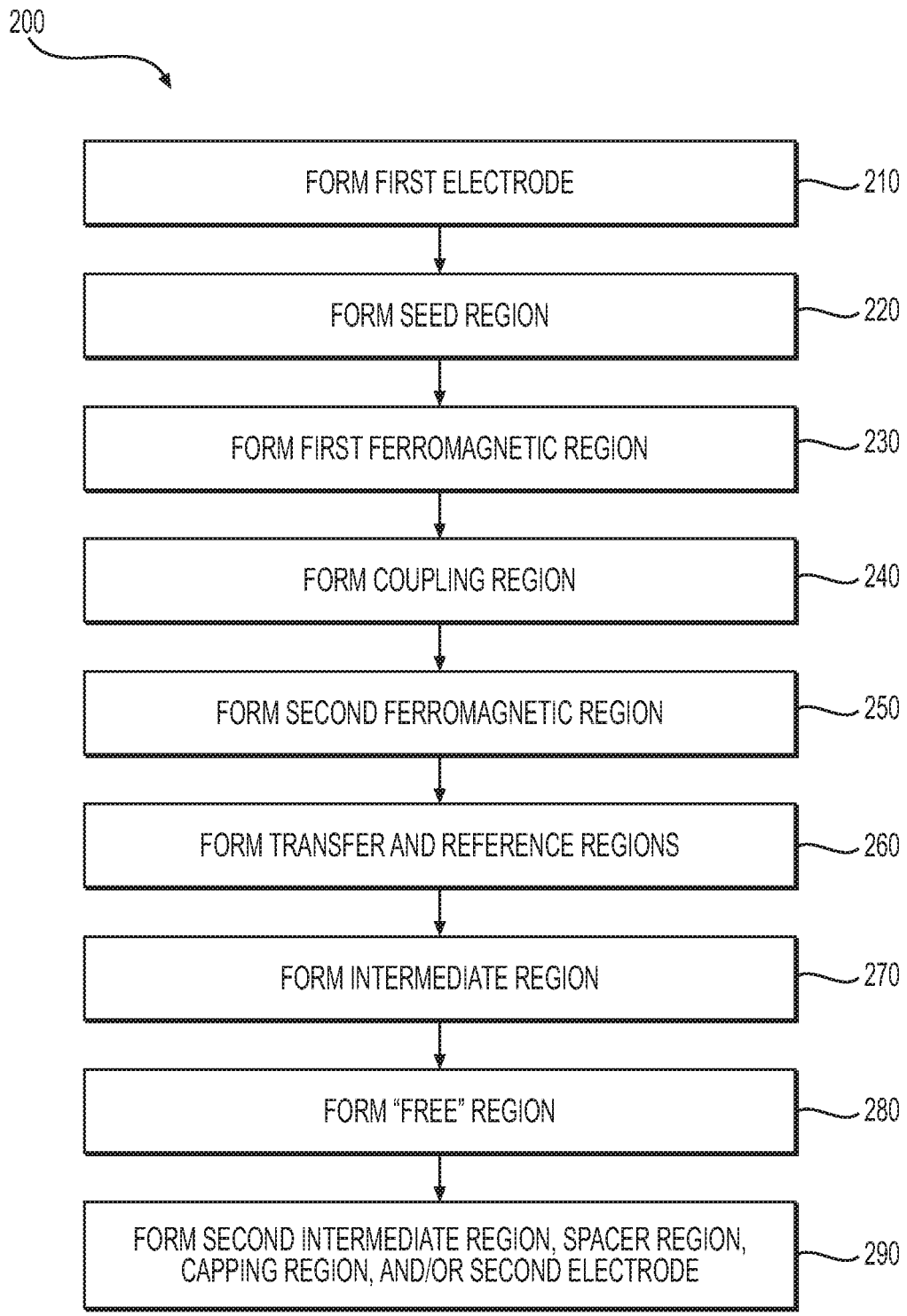
Figure 16A:
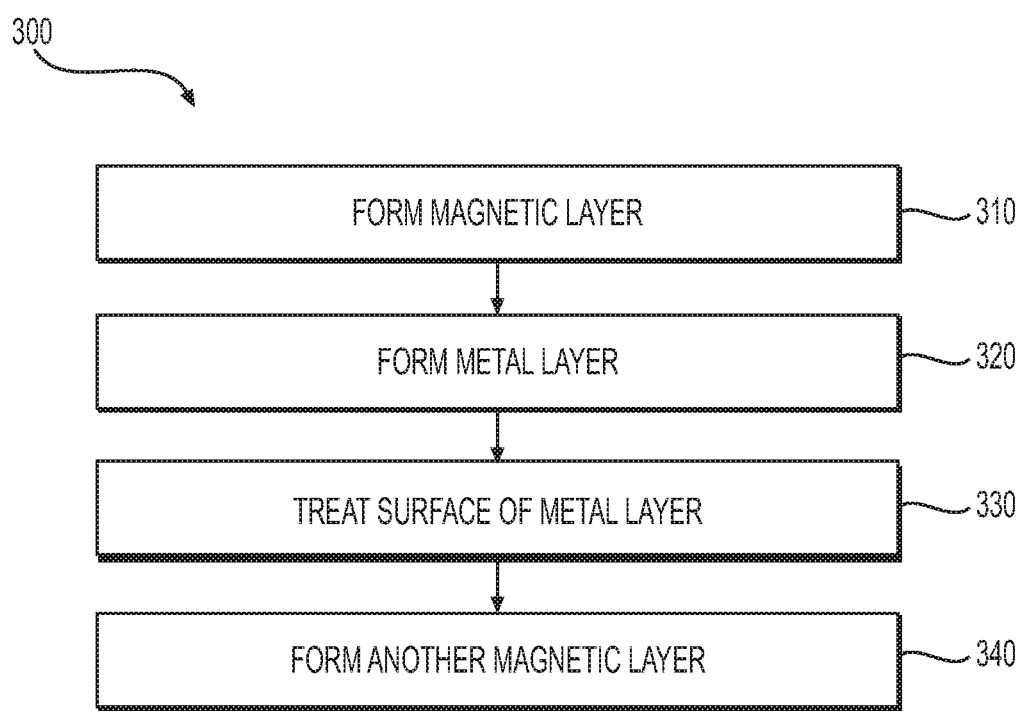
Figure 16B:
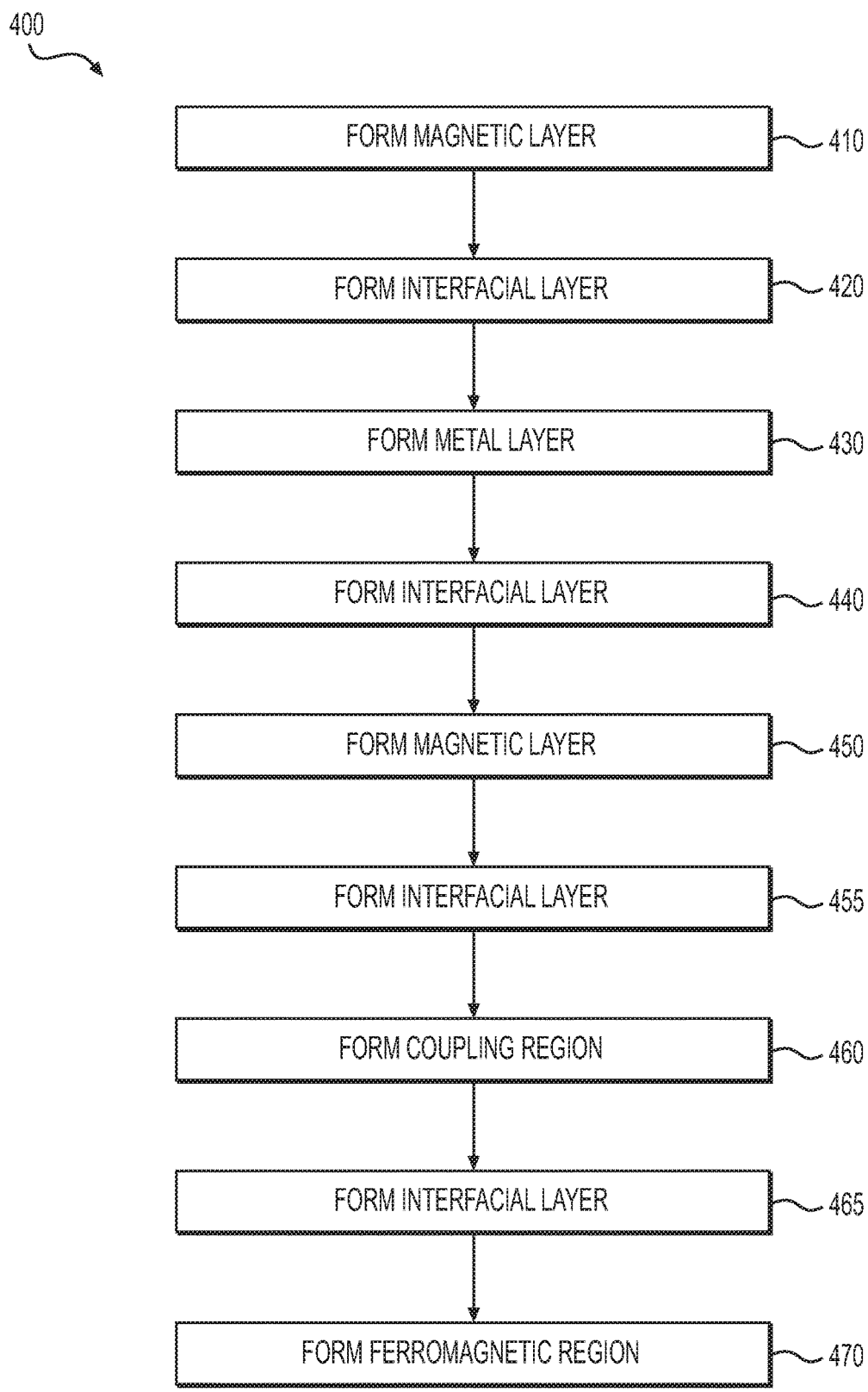

FIG. 1 illustrates a cross-sectional view of layers of an exemplary MTJ-type magnetoresistive stack/structure (for example, an in-plane or out-of-plane magnetic anisotropy magnetoresistive stack/structure (e.g., a perpendicular magnetic anisotropy magnetoresistive stack/structure)) including an intermediate layer, such as, for example, a dielectric layer, disposed between a "free" magnetic layer (or region) and a "fixed" magnetic layer (or region) wherein, in some exemplary embodiments, the "fixed" magnetic layer may be disposed between an electrode and a dielectric layer (which may be a tunnel barrier in the completed structure), according to at least certain aspects of certain embodiments of the present inventions; in this exemplary embodiment, the MTJ-type magnetoresistive stack/structure is disposed between and in physical contact with electrically conductive electrodes/vias/lines made of (for example, in the context of electrodes or vias, tantalum, or an alloy thereof (such as a tantalum-nitride alloy), or a composite thereof (such as a tantalum and tantalum-nitride alloy composite)); notably, the "free" magnetic layer and the "fixed" magnetic layer may each include a plurality of layers of magnetic or ferromagnetic material(s) (for example, nickel, iron, cobalt, palladium, platinum, magnesium, manganese, chromium, and alloys thereof) as well as one or more synthetic antiferromagnetic structures (SAF) or synthetic ferromagnetic structures (SyF), wherein one or more layers of magnetic materials layers may also include one or more non-magnetic materials layers (for example, ruthenium, copper, aluminum, tantalum, titanium, niobium, vanadium, zirconium, and one or more alloys thereof, and in certain embodiments, tungsten and molybdenum); moreover, the dielectric layers may be, for example, one or more layers of, for example, an aluminum oxide (e.g., $Al_2O_3$) and/or magnesium oxide (MgO);

FIG. 2 illustrates a cross-sectional view of exemplary layers that may be included in an exemplary ferromagnetic region of the "fixed" magnetic region of the exemplary MTJ-type magnetoresistive stack/structure depicted in FIG. 1;

FIG. 3 illustrates a cross-sectional view of exemplary layers that may be included in another exemplary ferromagnetic region of the "fixed" magnetic region of the exemplary MTJ-type magnetoresistive stack/structure depicted in FIG. 1;

FIGS. 4 and 5 are cross-sectional views of exemplary layers that may be included in an exemplary "fixed" magnetic region of the exemplary MTJ-type magnetoresistive stack/structure depicted in FIG. 1;

FIGS. 6A-6G are experimental results comparing electrical and magnetic parameters of magnetoresistive devices with and without an exemplary surface treatment of the current disclosure;

FIG. 7 is a plot showing the observed magnetization versus magnetic field hysteresis loop with and without an exemplary surface treatment of the current disclosure;

FIGS. 8A-8C are experimental results showing the effect of an exemplary surface treatment in different regions of an exemplary magnetoresistive device of the current disclosure on observed electrical parameters;

FIGS. 9A-9D are experimental results showing the effect of an exemplary surface treatment in different regions of an exemplary magnetoresistive device of the current disclosure on observed electrical parameters;

FIGS. 10A and 10B are plots showing the effect of an exemplary surface treatment in different regions of an exemplary magnetoresistive device of the current disclosure on the observed magnetization versus magnetic field hysteresis loop;

FIGS. 11A-11D are experimental results comparing electrical and magnetic parameters of magnetoresistive devices with and without an exemplary interfacial layer of the current disclosure;

FIGS. 12A-12C are plots showing the effect of an exemplary interfacial layer in an exemplary magnetoresistive device of the current disclosure on the observed magnetization versus magnetic field hysteresis loop;

FIG. 13 is a schematic diagram of an exemplary magnetoresistive memory stack/structure electrically connected to an access transistor in a magnetoresistive memory cell configuration;

FIGS. 14A-14B are schematic block diagrams of integrated circuits including a discrete memory device and an embedded memory device, each including MRAM (which, in one embodiment is representative of one or more arrays of MRAM having a plurality of magnetoresistive memory stacks/structures, according to aspects of certain embodiments of the present disclosure;

FIG. 15 is a simplified exemplary manufacturing flow for the formation (e.g., via deposition) of layers of the exemplary MTJ-type magnetoresistive stack/structures described herein, according to at least certain aspects of certain embodiments of the present disclosure, wherein the various layers and/or regions are sequentially deposited, grown, sputtered, evaporated, and/or provided (used herein collectively as "deposited" or other verb tense (e.g., "deposit" or "depositing")) to provide the material stack/structure that, after further processing, is an MTJ-type magnetoresistive stack/structure (having, for example, a perpendicular magnetic anisotropy); and FIGS. 16A and 16B are simplified exemplary manufacturing flows for the formation of a ferromagnetic region of the "fixed" region of the exemplary MTJ-type magnetoresistive stack/structures described herein, according to at least certain aspects of certain embodiments of the present disclosure.

It should be noted that, although individual regions of FIGS. 1-5 are illustrated as distinct layers with sharp, well-defined boundaries, typically, the materials of two adjacent layers at an interface (between the layers) may diffuse into each other, and present an interfacial region of an alloy or a combination of the materials of the two individual layers. Further, while all of the layers or regions of these figures may be present and distinguishable immediately after formation of these regions, in some embodiments, it may be difficult to distinguish some of these regions in a cross-section. In some embodiments, some of these layers may appear as an interfacial region having a higher concentration of an element or a material.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, means the value, limit, and/or range±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a "region" (as used herein) may include a single layer (or coating) of material or multiple layers of materials stacked one on top of another to form a multi-layer system. Further, although in the description below, the different regions in the disclosed stack/structure are referred to by specific names (capping region, reference region, transition region, etc.), this is only for ease of description and not intended as a functional description of the layer.

As alluded to above, in one exemplary aspect, the magnetoresistive stack/structure of the present disclosure may be implemented as a spin-torque magnetoresistive random access memory ("MRAM") element ("memory element"). In such aspects, the stack/structure may include an intermediate region positioned (or sandwiched) between two ferromagnetic regions to form a magnetic tunnel junction (MTJ) device or an MTJ-type device. The intermediate region may be a tunnel barrier and may include an insulating material, such as, e.g., a dielectric material. In other embodiments, the intermediate region may be a conductive material, e.g., copper, gold, or alloys thereof. In these other embodiments, where the magnetoresistive stack/structure includes a conductive material in between two ferromagnetic regions, the magnetoresistive stack/structure may form a GMR or GMR-type device.

Of the two ferromagnetic regions disposed on either side of the intermediate region, one ferromagnetic region may be a magnetically "fixed" or pinned region, and the other ferromagnetic region may be a magnetically "free" region. As alluded to above, the term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector does not move substantially in response to such applied magnetic fields or spin-polarized currents. As is known in the art, an electrical resistance of the described magnetoresistive stack/structure may change based on whether the magnetization direction (e.g., the direction of the magnetic moment) of the "free" region is in a parallel alignment or in an antiparallel alignment with the magnetization direction (e.g., the direction of the magnetic moment) of the "fixed" region. Typically, if the two regions have the same magnetization alignment, the resulting relatively low(er) resistance is considered as a digital "0," while if the alignment is antiparallel the resulting relatively higher resistance is considered to be a digital "1." A memory device (such as an MRAM) may include multiple such magnetoresistive stacks/structures, which may be referred to as memory cells or elements, arranged in an array of columns and rows. By measuring the current through each cell, the resistance of each cell, and thus the data stored in the memory array can be read.

Switching the magnetization direction of the "free" region of a magnetoresistive stack/structure may be accomplished by driving an electrical current pulse through the magnetoresistive stack/structure. The polarity of the current pulse determines the final magnetization state (e.g., parallel or antiparallel) of the "free" region. The mean current required to switch the magnetic state of the "free" region may be referred to as the critical current (Ic). The critical current is indicative of the current required to "write" data in (or the write current of) a magnetoresistive memory cell. Reducing the required write current(s) is desirable so that, among other things, a smaller access transistor can be used for each memory cell and a higher density, lower cost memory can be produced.

Magnetoresistance ratio (MR) is the ratio of the change in resistance of a magnetoresistive stack/structure between its "high" and "low" resistance states (MR=$(R_H-R_L)/R_L$, where $R_L$ and $R_H$ are the magnetoresistive stack/structure resistance in the low and high resistance states, respectively). MR is indicative of the strength of the signal when a memory element is "read." For an MTJ-type magnetoresistive stack/structure with a strong read signal, a larger MR (i.e., a larger difference between the individual resistances $R_H$ and $R_L$) is desirable. When the intermediate region of magnetoresistive stack/structure is a tunnel barrier made of a dielectric material, the resistance may be measured by the resistance-area product (RA). As used herein "delta RA" refers to a change in the magnetoresistance times area. Embodiments of the present disclosure relate to methods and apparatus for minimum impact on RA and delta RA and/or MR and other magnetic properties with improved tunnel barrier quality (for example, less defect and pinhole in tunnel barrier).

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack/structure having one or more electrically conductive electrodes, vias, or conductors on either side of a magnetic material stack. As described in further detail below, the magnetic material stack/structure may include many different layers of material, where some of the layers include magnetic materials, whereas others do not. In one embodiment, the methods of manufacturing include sequentially depositing, growing, sputtering, evaporating, and/or providing (as noted above, herein collectively "depositing" or other verb tense (e.g., "deposit" or "deposited")) layers and regions which, after further processing (for example, etching) those layers form a magnetoresistive stack/structure.

The magnetoresistive stacks/structures of the present inventions may be formed between a top electrode/via/line (e.g., electrode 90) and a bottom electrode/via/line (e.g., electrode 10) and, which permit access to the stack/structure by allowing for connectivity (for example, electrical) to circuitry and other elements of the magnetoresistive device. Between the electrodes/vias/lines are regions (i.e., regions made of one or more layers), including at least one "fixed" magnetic region (which includes, among other things, a plurality of ferromagnetic layers), a seed region (which in at least one embodiment is disposed between the electrically conductive electrode/via/line and the at least one "fixed" magnetic region), at least one "free" magnetic region (which includes, among other things, a plurality of ferromagnetic layers), and one or more dielectric regions disposed between a "fixed" magnetic region and the "free" magnetic region, to provide an intermediate region (e.g., a tunnel barrier layer) therebetween. In some embodiments, the top electrode (and/or the bottom electrode) may be eliminated, and the bit line may be formed on top of the stack.

FIG. 1 is a cross-sectional view of regions (or layers) of an exemplary MTJ-type magnetoresistive stack/structure 100 (for example, an in-plane or out-of-plane magnetic anisotropy magnetoresistive stack/structure (e.g., a perpendicular magnetic anisotropy magnetoresistive stack/structure)). It will be recognized that several other commonly-used regions (or layers) (e.g., various protective cap layers, seed layers, underlying substrate, etc.) have not been illustrated in FIG. 1 (and in subsequent figures) for clarity. As illustrated in FIG. 1, magnetoresistive stack/structure 100 includes multiple regions arranged one over the other to form a stack/structure between a first electrode 10 and a second electrode 90. As shown in FIG. 1, first electrode 10 may be a "bottom" electrode, and second electrode 90 may be a "top" electrode. However, those of ordinary skill in the art will recognize that the relative order of the various regions of magnetoresistive stack/structure 100 may be reversed. For example, first electrode 10 may be a top electrode and second electrode 90 may be a bottom electrode. Further, in some embodiments, the top electrode (and/or the bottom electrode) may be eliminated, and the bit line may be formed on top of the stack. The bottom and top electrodes 10, 90 may comprise an electrically conductive material, and may be part of (or be in physical contact with) electrically conductive interconnects (e.g., vias, traces, lines, etc.) of magnetoresistive stack/structure 100. Although any electrically conductive material may be used for bottom and top electrodes 10, 90, in some embodiments, a metal such as tantalum (Ta), titanium (Ti), tungsten (W), or a composite or alloy of these elements (e.g., tantalum-nitride alloy) may be used.

With continuing reference to FIG. 1, "fixed" region 20 may be formed on or above bottom electrode 10. Although not illustrated in FIG. 1, in some embodiments, bottom electrode 10 may be formed on a planar surface of a semiconductor substrate (e.g., a semiconductor substrate having transistors, etc. formed thereon). "Fixed" region 20 may serve as a "fixed" magnetic region of magnetoresistive stack/structure 100. That is, a magnetic moment vector in the "fixed" region 20 does not move significantly in response to applied magnetic fields (e.g., an external field) or applied currents used to switch the magnetic moment vector of "free" region 60, as explained above. In some embodiments, a seed region 12 may be disposed between electrode 10 and "fixed" region 20. Seed region 12 may facilitate the formation of "fixed" region 20 on electrode 10. In embodiments where electrode 10 provides the desired growth characteristics for the subsequent layers, seed region 12 may be omitted. Though seed region 12 is depicted as a single layer, those of ordinary skill in the art will understand that seed region 12 also may include a multi-layer structure. Seed region 12 may include one or more of nickel (Ni), chromium (Cr), cobalt (Co), iron (Fe), and alloys thereof (for example, an alloy including nickel (Ni) and/or chromium (Cr)) having a thickness which is greater than or equal to approximately 30 Å, or greater than or equal to approximately 40 Å, or greater than or equal to approximately 50 Å, or preferably greater than or equal to approximately 60 Å, or more preferably greater than or equal to approximately 40 Å or approximately 50 Å and less than or equal to approximately 100 Å (for example, approximately 40 Å to approximately 60 Å), or even more preferably greater than or equal to approximately 60 Å and less than or equal to approximately 100 Å, or most preferably approximately 60 Å+1-10%. In some embodiments, as depicted in FIG. 1, seed region 12 may be disposed between and in physical contact with electrode 10 (or an electrically conductive metal of an electrode/via/line) and "fixed" magnetic region 20.

Turning now to "fixed" region 20, an exemplary embodiment of "fixed" region 20 comprising a plurality of stacked regions is illustrated in FIG. 1. It should be noted that, for the sake of clarity, only certain regions that comprise the "fixed" region 20, and only certain exemplary regions on either side of the "fixed" region 20 (e.g., electrode 10 and intermediate region 50) are illustrated in FIG. 1. Those of ordinary skill in the art will readily recognize that one or more additional layers, interface areas, and/or regions may be included within "fixed" region 20 and/or may be disposed between the layers of "fixed" region 20 and the depicted exemplary regions on either side of "fixed" region 20. In general, "fixed" region 20 may have any thickness. In some embodiments, the "fixed" region 20 may have a thickness in the range of approximately 8 Å to approximately 300 Å, approximately 15 Å to approximately 110 Å, greater than or equal to 8 Å, greater than or equal to 15 Å, less than or equal to 300 Å, or less than or equal to 110 Å. "Fixed" region 20 may be deposited or formed using any technique now known or later developed; all of which are intended to fall within the scope of the present disclosure. In some embodiments, "fixed" region 20 may include one or more synthetic antiferromagnetic structures (SAF) or synthetic ferrimagnetic structures (SyF). Since SAFs and SyFs are known to those skilled in the art, additional description is omitted for sake of brevity.

In some embodiments, "fixed" region 20 may be a fixed, unpinned synthetic antiferromagnetic (SAF) structure, which may include at least two ferromagnetic regions 122, 132 separated by an antiferromagnetic (AF) coupling region 30. Ferromagnetic regions 122 and 132 may sometimes be referred to as Anti-Parallel layer 1 (AP1) and Anti-Parallel layer 2 (AP2), respectively. In some embodiments, as will be described in more detail later with reference to FIGS. 2 and 3, at least one of the ferromagnetic regions 122, 132 (i.e., AP1 and/or AP2) may include a multi-layer structure that includes a plurality of layers of (i) a first ferromagnetic material (e.g., cobalt) and (ii) a second ferromagnetic material (e.g., nickel (Ni)) or a paramagnetic material (e.g., platinum (Pt), palladium (Pd), etc.). "Fixed" magnetic region 20 may also include a transition region 34 and/or a reference region 36 disposed between ferromagnetic region 132 and intermediate region 50, which as noted above may include a layer of dielectric material (forming a tunnel barrier) in the MTJ structure. In some embodiments, as shown in FIG. 1, both transition region 34 and reference region 36 may be provided, while in other embodiments, only one of transition region 34 or reference region 36 may be provided. Transition region 34 and/or reference region 36 may include one or more layers of material that, among other things, may facilitate/improve the growth (or formation) of intermediate region 50 during fabrication. In some embodiments, reference region 36 may include one or more or all of cobalt (Co), iron, (Fe), and boron (B) (for example, in an alloy—such as an amorphous alloy (e.g., CoFeB, CoFeBTa, CoFeTa, etc.)), and transition region 34 may include a non-ferromagnetic transition metal such as tantalum (Ta), titanium (Ti), tungsten (W), ruthenium (Ru), niobium (Nb), zirconium (Zr), molybdenum (Mo), etc.

In some embodiments, reference region 36 also may include a multi-layer structure. For example, reference region 36 may include a layer of iron (Fe) (for example, deposited as pure or substantially pure iron (Fe)) and a layer of cobalt (Co), iron (Fe), and boron (B) (for example, deposited as an alloy), wherein, after further/final processing (e.g., after annealing), the layer of iron (Fe) at the interface may form a continuous atomic layer or may mix with the underlying ferromagnetic alloy in the final annealed structure, resulting in a high-iron (Fe) interface region within reference region 36 adjacent to intermediate region 50. In some embodiments, transition region 34 may be formed by depositing (or by another process) one or more non-ferromagnetic layers that alloy with one or more of the neighboring ferromagnetic regions (e.g., region 132), for example, during or in conjunction with a subsequent annealing process to thereby form transition region 34. In some embodiments, an alloy material may be directly deposited as transition region 34 and or reference region 36. In general, transition region 34 and reference region 36 may have any thickness. In some embodiments, a thickness (t) of transition region 34 may be approximately 1-8 Å, preferably approximately 1.5-5 Å, and more preferably approximately 2.5-3.5 Å. In some embodiments, a thickness (t) of reference region 36 may be approximately 6-13 Å, preferably approximately 8-12 Å, and more preferably approximately 9-9.5 Å. In embodiments where an alloy material is directly deposited as transition region 34, the thickness of the region may be approximately 8 Å. In some embodiments, transition region 34 and/or reference region 36 may have sub-atomic thicknesses.

As a person skilled in the art would recognize, in some cases, after deposition (over time, after exposure to high temperatures, etc.), the material of the deposited region (e.g., any of the regions or layers described herein) may migrate into (diffuse, etc.) an adjoining region (e.g., underlying region, etc.) to form an alloy. In such embodiments, e.g., although transition and reference regions 34, 36 may appear as distinct layers immediately after formation of these regions, after subsequent processing operations (e.g., annealing), these regions may mix or alloy together to form a single alloyed region with (or separate from) other regions of "fixed" region 20. Thus, in some cases, it may be difficult to distinguish regions 34 and 36 as being separate from regions in "fixed" region 20 of a finished magnetoresistive stack/structure 100. Instead, a region at the interface of "fixed" region 20 with its overlying region (e.g., region 50 in FIG. 1) may have a greater concentration of the material(s) that forms transition region 34 and reference region 36.

With renewed reference to FIG. 1, a "free" region 60 (or storage region or layer) is arranged atop "fixed" region 20 with an intermediate region 50 positioned between "fixed" region 20 and "free" region 60. In some embodiments, the intermediate region 50 may include a dielectric material and may function as a tunnel barrier. Intermediate region 50 may be formed on or above a surface of "fixed" region 20, and "free" region 60 may be formed on or above a surface of intermediate region 50. In some embodiments, intermediate region 50 may include an oxide material, such as, for example, $MgO_x$ (e.g., MgO) or $AlO_x$ (e.g., $Al_2O_3$), and may be formed by multiple steps of material deposition and oxidation. In general, intermediate region 50 may have any thickness. In some embodiments, intermediate region 50 may have a thickness of approximately 8.5-14.1 Å, preferably between 9.6-13.0 Å, and more preferably between 9.8-12.5 Å.

Although not illustrated in FIG. 1, in some embodiments, "free" region 60 may also include one or more ferromagnetic layers/regions (similar to "fixed" region 20). For example, in some embodiments, "free" region 60 may comprise at least two ferromagnetic regions separated by a coupling region (e.g., including tantalum (Ta), tungsten (W), molybdenum (Mo), ruthenium (Ru), rhodium (Rh), rhenium (Re), iridium (Ir), chromium (Cr), osmium (Os), and their combinations). The coupling region may provide either ferromagnetic coupling or antiferromagnetic coupling between the ferromagnetic layers/regions of the "free" region 60. Notwithstanding the specific construction of "free" region 60, "free" region 60 may include a magnetic vector (or moment) that can be moved or switched by applied magnetic fields or spin torque currents. "Free" region 60 may be formed from any ferromagnetic material having two or more stable magnetic states. These materials may include alloys of one or more of the ferromagnetic elements nickel (Ni), iron (Fe), cobalt (Co), and boron (B). Additional elements may be added to the alloys to provide improved magnetic, electrical, or microstructural properties. In some embodiments, similar to "fixed" region 20, "free" region 60 also may include one or more SAF or SyF structures. In general, "free" region 60 may have any thickness, such as, for example, approximately 7-40 Å, preferably approximately 20-30 Å, and more preferably approximately 25-28.5 Å.

With continuing reference to FIG. 1, in some embodiments, a second intermediate region 70 may be positioned on or above "free" region 60. Similar to intermediate region 50, intermediate region 70 may also include a dielectric material and may function as a tunnel barrier. In some embodiments, intermediate region 70 may include an oxide material, such as, for example, $MgO_x$ or $AlO_x$ (e.g., $Al_2O_3$). In general, intermediate region 70 may have any thickness. In some embodiments, intermediate region 70 may have a similar thickness as intermediate region 50. In other embodiments, intermediate region 70 may have a greater or less thickness than intermediate region 50. In some embodiments, intermediate region 70 may have a thickness of approximately 8.5-14.1 Å, preferably approximately 9.6-13.0 Å, and more preferably approximately 9.8-12.5 Å. In some embodiments, as illustrated in FIG. 1, a spacer region 82 may be formed on or above intermediate region 70, and a capping region 86 may be formed between spacer region 82 and second electrode 90. It is understood, however, that either of spacer region 82 or capping region 86 may be omitted. Spacer region 82 may be formed of an electrically conductive non-ferromagnetic material, such as, for example, ruthenium (Ru). In some embodiments, spacer region 82 may include a multi-layer stack, such as, for example, a layer of ruthenium (Ru) and one or more layers of cobalt (Co), iron (Fe), boron (B), or an alloy thereof (e.g., CoFeB). Although spacer region 82 may, in general, have any thickness, in some embodiments, spacer region may have a thickness of approximately 5-35 Å, preferably approximately 7-30 Å, and more preferably approximately 10-25 Å. In some embodiments, spacer region 82 may include a layer or ruthenium (Ru) (e.g., having a thickness of approximately 10-20 Å) and a layer of CoFeB (e.g., having a thickness of approximately 5-15 Å). Capping region 86 may include any suitable material and thickness. In some embodiments, capping region 86 may be formed materials, such as, for e.g., tantalum (Ta), tungsten (W), titanium (Ti), tantalum nitride (TaN), etc. Although not a requirement, in some embodiments, the thickness of the capping region 86 may be approximately 20-150 Å, or preferably approximately 30-100 Å, or more preferably approximately 40-70 Å.

It should be noted that the configuration (e.g., structure, etc.) of magnetoresistive stack 100 of FIG. 1 is only exemplary. As those with ordinary skill in the art will recognize, magnetoresistive stack 100 may have many other configurations. For example, in some embodiments, magnetoresistive stack 100 may have a dual spin filter structure in which a second "fixed" region is provided above intermediate region 70. In some embodiments, the second "fixed" region may also have a structure similar to that of "fixed" region 20. Specifically, the second "fixed" region may also include two ferromagnetic regions (AP1, AP2) with a coupling region positioned in between. U.S. Pat. Nos. 8,686,484; 8,747,680; 9,023,216; 9,136,464; and 9,419,208, and U.S. patent application Ser. No. 15/831,736 (filed Dec. 5, 2017); 62/591,945 (filed Nov. 29, 2017); 62/594,229 (filed Dec. 4, 2017); 62/580,612 (filed Nov. 2, 2017); 62/582,502 (filed Nov. 7, 2017), and 62/588,158 (filed Nov. 17, 2017), incorporated by reference in their enterities herein, describe exemplary configurations of magnetoresistive stacks and methods of making such magnetoresistive stacks.

As explained previously, ferromagnetic regions 122 and 132 of "fixed" region 20 may include a multi-layer structure. FIG. 2 illustrates an exemplary multilayer structure of ferromagnetic region 122 (i.e., AP1). As illustrated in FIG. 2, in some embodiments, ferromagnetic region 122 may include multiple alternating layers of two different ferromagnetic materials formed one on top of the other. For example, ferromagnetic region 122 may include a multi-layer stack of alternating layers, namely a magnetic layer 110 and a second metal layer 120. That is, metal layer 120a is formed over a magnetic layer 110a and a further magnetic layer 110b is formed over the metal layer 120a, etc. Though the present embodiment contemplates two alternating layers, those of ordinary skill will understand that a greater or lesser number of layers may be repeated as suitable. Magnetic layer 110 may include a ferromagnetic material, such as, for example, cobalt (Co), or a cobalt based alloy (for example, CoFe alloy with Co more than or equal to approximately 80 atomic percent). And, metal layer 120 may include materials, such as, for example, platinum (Pt), palladium (Pd), nickel (Ni), gold (Au), etc. In some embodiments, magnetic layer 110 may be formed of cobalt (Co) and the second metal layer 120 may be formed of platinum (Pt) (or palladium (Pd)). In general, magnetic layer 110 and metal layer 120 may be stacked to form any number of magnetic layer pairs (marked 1-6 in FIG. 2). Each layer pair includes a metal layer 120 formed (e.g., deposited) on a magnetic layer 110. Although FIG. 2 illustrates six metal layers 120a-f formed between seven magnetic layers 110a-g, in general, the number of magnetic and metal layers 110, 120, respectively, in ferromagnetic region 122 may be between 2 and 15. Magnetic and metal layers 110, 120 may have any thickness. In some embodiments, each magnetic and metal layer 110, 120 may have a thickness of approximately 1.5-8 Å, preferably approximately 2-6 Å. In some embodiments, each magnetic and metal layer 110, 120 may have a thickness greater than approximately 2 Å and less than approximately 6 Å, preferably greater than approximately 2.5 Å and less than approximately 4.5 Å, and more preferably approximately 3 Å.

In some embodiments, ferromagnetic region 122 may be formed by sequentially forming (e.g., depositing) the materials that comprise magnetic layer 110 (e.g., cobalt (Co)) and metal layer 120 (e.g., platinum (Pt), palladium (Pd), nickel (Ni), etc.) one over the other. Any suitable process or processes may be used to form the different layers 110, 120 of ferromagnetic region 122. In some embodiments, techniques such as, for example, physical vapor deposition (e.g., ion beam sputtering, magnetron sputtering, etc.), chemical vapor deposition, plasma-enhanced chemical vapor deposition, etc. may be used to form layers 110, 120. Formation of ferromagnetic region 122 may also involve known processing steps such as, for example, selective deposition, photolithography processing, etching, annealing, etc., in accordance with any of the various conventional techniques known in the semiconductor industry. In some embodiments, during deposition of ferromagnetic region 122 (e.g., during formation of some or all of layers 110, 120), a magnetic field may be applied to set a preferred easy magnetic axis of the region (e.g., via induced anisotropy). Similarly, a strong magnetic field applied during a post-deposition high-temperature anneal step may be used to induce a preferred easy axis and a preferred pinning direction for any antiferromagnetically pinned materials or exchange coupled pinning materials. Since these techniques are known to those of ordinary skill in the art, they are not described here in greater detail.

Similar to ferromagnetic region 122, ferromagnetic region 132 (i.e., AP2) of "fixed" region 20 may also include a multi-layer structure comprising an alternating multi-layer stack of a magnetic layer 110 and a metal layer 120. FIG. 3 illustrates an exemplary multilayer structure of ferromagnetic region 132 having magnetic layers $110v$-$110z$ and metal layers $120v$-$120y$. In general magnetic layers $110v$-$z$ may include a ferromagnetic material, such as, for example, cobalt (Co), iron (Fe), a cobalt based alloy, or an iron based alloy. And, metal layers $120v$-$y$ may include materials, such as, for example, platinum (Pt), palladium (Pd), nickel (Ni), gold (Au), etc. In some embodiments, magnetic layers $110v$-$110z$ may include cobalt (Co) and the metal layers $120v$-$120y$ may include platinum (Pt) (or palladium (Pd)). As explained above with reference to ferromagnetic region 122, magnetic and metal layers 110, 120 of ferromagnetic region 132 may be stacked to form any number of layer pairs (marked 1-4 in FIG. 3). Although FIG. 3 illustrates four metal layers $120v$-$120y$ formed between five magnetic layers $110v$-$110z$, in general, the number of magnetic and metal layers 110, 120 in ferromagnetic region 132 may be between 2 and 15. In some embodiments, the number of magnetic and metal layers 110, 120 (and magnetic layer pairs) in ferromagnetic region 132 may be less than that in ferromagnetic region 122. That is, in some embodiments, AP2 may have a smaller number of magnetic and metal layer pairs than AP1. The thickness of magnetic and metal layers 110, 120 in ferromagnetic region 132 may be similar to that described in connection with ferromagnetic region 122. Magnetic and metal layers 110, 120 of ferromagnetic region 132 may also be formed in a similar manner as magnetic and metal layers 110, 120 of ferromagnetic region 122. In some embodiments, the magnetic and metal layers ($110a$ and $110g$ in region 122, $110v$ and $110z$ in region 132) in region 122 and 132 may be thicker than other magnetic layers 110.

In some embodiments, ferromagnetic regions 122 and 132 may have strong magnetic anisotropy and may be antiferromagnetically coupled to each other by coupling region 30. In some embodiments, strong perpendicular magnetic anisotropy (PMA) of ferromagnetic regions 122 and 132 may require one or both of these regions to have a strong crystalline orientation. In some embodiments, a strong crystalline orientation of one or both of ferromagnetic regions 122 and 132 may be desirable to maintain strong exchange coupling (e.g., large $1^{st}$ peak of antiferromagnetic exchange coupling) between these regions 122 and 132 via coupling region (e.g., an approximately 4 Å thick ruthenium (Ru) layer). Strong crystalline orientation (in some case with large grain size) of a region positioned under intermediate region 50 (see FIG. 1), which functions as a tunnel barrier in a magnetic tunnel junction device such as, for example, an MRAM, may result in a rough tunnel barrier and lead to reduced time dependent dielectric breakdown (TDDB) characteristics and/or endurance/reliability of a magnetoresistive device fabricated from the magnetoresistive stack 100.

In some embodiments of the current disclosure, one or both of ferromagnetic regions 122 and 132 may be configured such that the degree of crystallinity of the overlying regions (regions formed on or above these regions) is reduced without a significant reduction of PMA and/or exchange coupling strength between regions 122 and 132. For example, one or both of ferromagnetic regions 122 and 132 may be configured such that the crystallinity of intermediate region 50 (i.e., the tunnel barrier layer in an MTJ structure) is reduced. Reduced crystallinity of intermediate region 50 may result in a smoothened (or relatively smoother) intermediate region 50 (i.e., a smoothed tunneling barrier), and thereby lead to improved time dependent dielectric breakdown (TDDB) characteristics and/or an improved lifetime and/or improved endurance/reliability of a magnetoresistive device fabricated from magnetoresistive stack 100.

With reference to FIGS. 2 and 3, in some embodiments of the current disclosure, a surface of one or more metal layers $120a$-$120f$ of ferromagnetic region 122 (AP1) and/or of one or more metal layers $120v$-$120y$ ferromagnetic region 132 (AP2) may be treated or otherwise conditioned prior to the formation of an overlying region thereon. For example, in some embodiments, a surface of the topmost metal layer $120y$ of ferromagnetic region 132 may be treated prior to depositing the topmost magnetic layer $110z$ thereon. In some embodiments, the treatment may include oxidation of the surface of the metal layer $120y$ prior to forming the overlying layer (e.g., magnetic layer $110z$) thereon. For example, in embodiments where the metal layer 110 is a platinum (Pt) layer, a thin platinum oxide ($PtO_x$) layer may be formed (for example, $PtO_2$ or PtO) when the surface of the Pt layer is treated by exposing to an oxygen environment. In some embodiments, the oxidation may include exposing the surface of the metal layer $120y$ to a flow of oxygen (substantially pure oxygen or a mixture of oxygen with other gases (e.g., 2-80% oxygen in nitrogen)) having a flow rate of approximately 0.25-10 sccm (standard cubic centimeters per minute), at a pressure of approximately 0.01-10 milliTorr (mTorr), for a duration of approximately 5-100 seconds.

In some embodiments, the treated surface (e.g., the surface of metal layer $120y$ that is treated) may be oxidized by "natural oxidation." During "natural oxidation," the surface of the treated metal layer $120y$ may be exposed to an oxygen containing atmosphere at a pressure of approximately 0.01-

10 mTorr at a temperature less than approximately 35° C. Oxidation at temperatures less than approximately 35° C. is referred to as low temperature or "natural oxidation" because it resembles (in speed and self-limiting behavior) the oxidation that occurs during exposure to air (e.g., clean-room air) at room temperatures. It should be noted that natural oxidation of the metal layer 120y surface is typically performed in an enclosed chamber (e.g., an oxidation chamber, deposition chamber, etc.) since oxidizing the surface by exposing it to clean-room room air is not a viable option during IC fabrication (for example, to prevent defective devices due to contamination, etc.). In some embodiments, the surface treatment of metal layer 120y may be performed without causing a vacuum break in the manufacturing process. For example, after forming the metal layer 120y (e.g., depositing a layer of, e.g., platinum (Pt), palladium (Pd), etc., to form metal layer 120y of pair 4 on magnetic layer 110y of pair 4), the surface of the formed metal layer 120y may be oxidized in the same deposition chamber that was used for depositing this layer, and the topmost magnetic layer 110z may be deposited on the oxidized surface of the metal layer 120y in the same deposition chamber without causing a vacuum break. However, this is not a requirement. That is, in some embodiments, the deposition and oxidation may be carried out in different chambers during the manufacturing process.

In some embodiments, natural oxidation of the exposed surface of the metal layer 120y may include exposing the metal layer 120y to substantially pure oxygen or a mixture of oxygen with other gases (e.g., 2-80% oxygen in nitrogen), at a pressure of approximately 0.03-0.15 mTorr or less, for approximately 10-100 seconds, at temperatures less than approximately 35° C. In some embodiments, oxidizing the exposed surface of metal layer 120y may involve exposing the surface to substantially pure oxygen or a mixture of oxygen with other gases (e.g., 2-80% oxygen in nitrogen), at a relatively higher pressure (e.g., between approximately 0.15 to 10 mTorr) for a relatively longer time (e.g., up to approximately a few thousand seconds, preferably approximately 100-2000 seconds), at temperatures less than approximately 35° C. The oxidation is preferably performed in a process chamber with low levels of water vapor. For example, in some embodiments, the oxidation process may be performed in a chamber with a cryo-pump or with a cold-trap (water-pump) to prevent or reduce the effect of water vapor on the oxygen treated surface of 120.

Any of layers 120v-120y of ferromagnetic region 132 (AP2) or layers 120a-120f of ferromagnetic region 122 (AP1) may be surface treated (or oxidized) as described above. That is, the surface of any metal layer 120v-120y of any of magnetic layer pairs 1-4 of ferromagnetic region 132, or the surface of any metal layer 120a-120f of magnetic layer pairs 1-6 of ferromagnetic region 122, may be surface treated prior to forming a magnetic layer 110 thereon. In some embodiments, multiple (or all) metal layers 120a-120f and 120v-120y of ferromagnetic regions 122 and/or 132 may be surface treated. Treating the surface of a metal layer 120 by oxidizing the surface may reduce the roughness of the surface and/or change the surface morphology and result in reduced crystalline orientation (or texture) and smaller grain size of the layer(s) grown on or above the layer with oxygen treated surface. The reduction in crystallinity of the magnetic layer 110 grown on the oxygen treated surface of metal layer 120 may result in reduced crystallinity of the overlying regions. This reduction in crystallinity (and/or grain size) of the (upper regions of the) "fixed" region 20 may result in a smoother or smoothened intermediate region 50 with improved TDDB characteristics when region 50 is formed on or above "fixed" region 20. It should be noted that, in some cases, after formation of magnetoresistive stack 100, an oxide layer may not be visible (e.g., in a cross-section) on the surface of a treated metal layer 120. However, in some cases, compositional analysis (e.g., by energy-dispersive X-ray spectroscopy, etc.) may reveal the presence of an oxide (or another reaction product formed as a result of a reaction between the oxide and an adjoining region).

In some embodiments, alternative to (or in addition to) treating a surface a metal layer 120 of ferromagnetic regions 122 and/or 132, an interior region of a metal region 120 may be treated (e.g., with oxygen, etc. using the same processes described above). For example, in an embodiment where metal layer 120y of ferromagnetic region 132 (see FIG. 3) is a 3 Å thick platinum (Pt) layer, a 2 Å thick platinum (Pt) layer may first be formed (e.g., deposited) on the surface of the magnetic layer 110y. The surface of the partially formed metal layer (i.e., the formed 2 Å platinum (Pt) layer) may then be surface treated or oxidized as described above. And, a 1 Å thick platinum layer (Pt) subsequently may be formed on the treated surface. That is, rather than treating the surface of the completely formed metal layer 120y, an interior surface of metal layer 120y is treated (or oxidized) prior to forming magnetic layer 110z thereon. It should be noted that the above-described thicknesses (e.g., 2A, 1A, etc.) are only exemplary. In general, any initial thickness of metal layer may be deposited, the surface of the deposited layer treated, and the remaining thickness of the metal layer deposited atop the treated surface to complete metal layer 120. Any metal layer (120a-f) of ferromagnetic region 122 or metal layer 120v-y of ferromagnetic region 132 may be treated in the above-described manner. It is also contemplated that, in some embodiments, a surface of a magnetic layer 110 may be treated prior to depositing metal layer 120 thereon. That is, alternative to (or in addition to) treating an interior region or the surface of, for example, metal layer 120y of ferromagnetic region 132, the surface of magnetic region 110y may be surface treated (e.g., oxidized) prior to forming metal layer 120y thereon. Surface treating magnetic region 110 as described above may result in a relatively large increase in RA and a relatively large reduction in MR.

As explained above, exemplary embodiments of the magnetoresistive stack 100 of the current disclosure include a "fixed" region 20 having multiple ferromagnetic regions (e.g., ferromagnetic regions 122 and 132) coupled together by an antiferromagnetic (AF) coupling region (e.g., coupling region 30 made of a non-ferromagnetic material such ruthenium (Ru), iridium (Ir), rhodium (Rh), etc.) positioned in between the ferromagnetic regions. One or both of the ferromagnetic regions may comprise alternating layers of cobalt (Co) (iron (Fe), cobalt based alloy or iron based alloy) and platinum (Pt) (palladium (Pd), nickel (Ni), or gold (Au)). And one or more surfaces (or an interior region) of the platinum (Pt) (palladium (Pd), nickel (Ni), or gold (Au)) layer is surface treated by exposing the surface to a gas such as, for example, oxygen, a mixture of oxygen and nitrogen, etc. The surface treatment may result in a reduction in the roughness of the treated surface and reduction in the crystallinity and grain size of the layer grown on or above the treated surface, which in turn may result in facilitating the formation of a relatively smooth intermediate region 50 on top of the surface treated layers. The relatively smooth intermediate region 50 may result in a better TDDB performance of the MTJ structure without a significant reduction in PMA and exchange coupling between ferromagnetic regions 122 and 132 of "fixed" region 20.

It should be noted that surface treating the magnetic layer 110 and/or the metal layer 120 to facilitate the formation of a relatively smooth intermediate region 50 as described above is only exemplary. In some embodiments, as described in more detail below, the surface of one or more of the magnetic and/or the metal layers 110, 120 of ferromagnetic regions 122 and/or 132 may be deposited with one or more material(s) that assist in reducing the degree of crystallinity of the overlying region(s) (regions formed on or above these regions) without a significant reduction of PMA and/or exchange coupling strength between ferromagnetic regions 122 and 132. FIG. 4 illustrates an exemplary structure of a "fixed" region 20 (e.g., of magnetoresistive stack/structure 100 of FIG. 1) having ferromagnetic region 122 (AP1) and 132 (AP2) separated by coupling region 30. As explained with reference to FIGS. 2 and 3, ferromagnetic regions 122 and 132 may include multiple stacked magnetic layers 110 (layers 110a-110g of region 122 and layers 110v-110z of region 132) and metal layers 120 (layers 120a-120f of region 122 and layers 120v-120y of region 132). With reference to FIG. 4, in some embodiments, an interfacial layer 130a and/or 130b may be formed, for example, by depositing an interfacial material at the interface between some or all magnetic layers 110a-110f and metal layers 120a-120f. For example, after forming magnetic layer 110a, an interfacial material may be deposited on the exposed surface of magnetic layer 110a to form interfacial layer 130a. Metal layer 120a may then be deposited on the interfacial layer 130a.

Interfacial layer 130a may be formed at the interface between any magnetic and metal layer 110, 120, respectively, of ferromagnetic region 122. That is, at the interface between the magnetic and metal layers 110, 120, respectively, of any magnetic layer pair 1-6 of ferromagnetic region 122. In some embodiments, as illustrated in FIG. 4, an interfacial layer 130a may be formed at the interface between all the magnetic and metal layers 110, 120 of ferromagnetic region 122 (i.e., between the magnetic and metal layers 110, 120, respectively, of all magnetic layer pairs 1-6). In some embodiments, interfacial layer 130a may only be formed at the interface between the magnetic and metal layers 110, 120 of some magnetic layer pairs. For example, in some embodiments, an interfacial layer 130a may only be formed between the magnetic and metal layers of a single magnetic layer pair 1 (or 2, or 3, or 4, or 6) of ferromagnetic region 122. In some embodiments, an interfacial layer 130a may be formed between the magnetic and metal layers of multiple (e.g., less than all) magnetic layer pairs 1-6. For example, an interfacial layer 110a may be formed between the magnetic and metal layers of magnetic layer pair 1, and/or magnetic layer pair 2, and/or magnetic layer pair 3, and/or magnetic layer pair 4, and/or magnetic layer pair 5, and/or magnetic layer pair 6 of region 122.

In addition to, or as an alternative to, forming interfacial layers 130a in ferromagnetic region 122, in some embodiments, interfacial layers 130a may also be formed at the interface between magnetic and metal layers 110, 120 of ferromagnetic region 132. As described with reference to ferromagnetic region 132, interfacial layers 130a may be formed between the magnetic and metal layers 110, 120 of some or all magnetic layer pairs 1-4 of ferromagnetic region 132. For example, in some embodiments, an interfacial layer 130a may only be formed between the magnetic and metal layers of a single magnetic layer pair 1 (or 2, or 3, or 4) of ferromagnetic region 132. In some embodiments, an interfacial layer 130a may be formed between the magnetic and metal layers of multiple (e.g., less than all) magnetic layer pairs 1-4. For example, an interfacial layer 130a may be formed between the magnetic and metal layers of magnetic layer pair 1, and/or magnetic layer pair 2, and/or magnetic layer pair 3, and/or magnetic layer pair 4 of region 132. Forming an interfacial layer 130a at the interface between a magnetic and metal layer 110, 120 (i.e., below a metal layer 120) of a ferromagnetic region 122 and/or 132 may reduce the crystalline orientation (or texture) and/or grain size of the regions formed above the interfacial layer(s) 130a. The reduction in crystallinity may result in reduced crystallinity of the overlying regions and result in a smoother intermediate region 50 with improved TDDB characteristics and/or endurance/reliability.

In addition to, or as an alternative to, forming an interfacial layer 130a below a metal layer 120 (i.e., at the interface between a magnetic and a metal layer 110, 120) of a magnetic layer pair (of ferromagnetic regions 122, 132) as described above, in some embodiments, an interfacial layer 130b may be formed above the metal layer 120 of a magnetic layer pair. For example, with reference to FIG. 4, after depositing the materials that form the magnetic and metal layers 110a, 120a of magnetic layer pair 1 of ferromagnetic region 122, an interfacial material may be deposited on the surface of the metal layer 120a to form interfacial layer 130b. The magnetic layer 110b (of magnetic layer pair 2 of ferromagnetic region 122) may then be formed on the interfacial layer 130b. As described with reference to interfacial layer 130a, interfacial layer 130b may be formed on the metal layer 120 of a single magnetic layer pair (of ferromagnetic regions 122, 132), or on the metal layers of multiple magnetic layer pairs. That is, in some embodiments, interfacial layer 130b may be formed on the metal layer 120 of one of magnetic layer pairs 1-6 of ferromagnetic region 122, and/or on the metal layer 120 of one of magnetic layer pairs 1-4 of ferromagnetic region 132. In some embodiments, interfacial layers 130b may be formed on the metal layers 120 of multiple metal layers 120 of ferromagnetic regions 122 and/or 132. For example, interfacial layers 130b may be formed on the metal layers 120 of magnetic layer pair 1, and/or magnetic layer pair 2, and/or magnetic layer pair 3, and/or magnetic layer pair 4, and/or magnetic layer pair 5, and/or magnetic layer pair 6 of region 122. Additionally or alternatively, interfacial layers 130b may be formed on the metal layers 120 of magnetic layer pair 1, and/or magnetic layer pair 2, and/or magnetic layer pair 3, and/or magnetic layer pair 4 of ferromagnetic region 132.

It should be noted that although FIG. 4 illustrates interfacial layers 130a being provided below all the metal layers 120, and interfacial layers 130b being provided above all the metal layers 120, this is only exemplary. As explained above, in some embodiments, interfacial layers 130a and/or 130b may only be provided below/above selected metal layers 120. Interfacial layers 130a and 130b may be formed using any material that modulates the crystal structure of "fixed" region 20 (having a SAF structure) without causing a significant reduction in perpendicular magnetic anisotropy and exchange coupling between ferromagnetic region 122 (AP1) and ferromagnetic region 132 (AP2) through the coupling region 30. In some embodiments, interfacial layers 130a and 130b may include iron (Fe), an Fe based alloy (for example, FePt, FePd, FeMo, FeW, FeNi, FeB etc.), a Co based alloy (CoPd, CoW, CoMo, CoNi, CoB, etc), CoCr-based alloy, or an iron-cobalt alloy (CoFe). In some embodiments, the composition of the iron-cobalt alloy (CoFe) may be Fe more than approximately 20 atomic percent (preferably with Fe more than approximately 25 atomic percent)

and remaining Co. Although not a requirement, in some embodiments, both interfacial layers 130a and 130b may be formed using the same material. In some embodiments, the thickness of interfacial layers 130a and 130b may be less than or equal to approximately 2 Å (i.e., ≤2 Å), preferably less than or equal to approximately 1 Å (i.e., ≤1 Å). It should be noted that although interfacial layers 130a and 130b are illustrated in FIG. 4 as a continuous layer, this is only exemplary. In some embodiments, interfacial layers 130a and/or 130b may form a dusting (e.g., a discontinuous patchwork as opposed to a continuous layer) on the interface between the magnetic and metal layers 110, 120.

In some embodiments, as illustrated in FIG. 5, an interfacial layer 132a may be provided below the coupling region 30 between ferromagnetic regions 122, 132. Alternatively of additionally, in some embodiments, an interfacial layer 132b may be provided above the coupling region 30. Interfacial layers 132a and 132b may be provided in addition to, or as an alternative to, interfacial layers 130a and 130b discussed with reference to FIG. 4. Although FIG. 5 illustrates both interfacial layers 132a and 132b, this is only exemplary. In some embodiments, only one of interfacial layers 132a or 132b may be provided. To form interfacial layer 132a below coupling region 30, after forming the last magnetic layer of ferromagnetic region 122 (i.e., magnetic layer 110g of FIG. 5), an interfacial material may be deposited on the magnetic layer 110g to form interfacial layer 132a. Coupling region 30 may then be formed on the interfacial layer 132a. To form interfacial layer 132b, the interfacial material may be deposited on the coupling region 30 to form interfacial layer 132b, and ferromagnetic region 132 formed on the interfacial layer 132b. The materials used to form interfacial layers 132a, 132b may be the same as the materials used to form interfacial layers 130a, 130b (e.g., Fe, CoFe, etc.). Although, in general, interfacial layers 132a, 132b may have any thickness, in some embodiments, the thickness of interfacial layers 132a, 132b may be less than or equal to approximately 5 Å (i.e., ≤5 Å).

In addition to, or as an alternative to forming interfacial layers 132a, 132b, in some embodiments, the magnetic layer adjacent to the coupling region 30 on one or both sides (i.e., magnetic layer 110g and/or magnetic layer 110v of FIG. 5) may be replaced with the material that forms interfacial layers 132a, 132b (e.g., Fe, CoFe, etc.). To replace magnetic layer 110g with the interfacial material, after forming metal layer 120f, the interfacial material may be deposited on the metal layer 120f to form a layer having substantially the same thickness as the replaced metal layer (i.e., between approximately 2-8 Å, or between approximately 2-6 Å, or between approximately 2.5-4.5 Å, or approximately 3 Å). And, to replace magnetic layer 110v with the interfacial material, after forming coupling region 30, the interfacial material may be deposited on the coupling region 30 to form a layer having substantially the same thickness as the replaced metal layer (i.e., between approximately 2-8 Å, or between approximately 2-6 Å, or between approximately 2.5-5.5 Å, or approximately 4 Å). In some embodiments, the entire thickness of the magnetic layer (i.e., magnetic layer 110g and/or magnetic layer 110v of FIG. 5) may not be replaced with interfacial material. Instead, a portion of the thickness of the magnetic layer may be replaced with the interfacial material. For example, in some embodiments, an approximately 4 Å thick cobalt magnetic layer 110g (and/or magnetic layer 110v) may be replaced with an approximately 2 Å thick cobalt layer (or any thickness less than 4 Å) and interfacial material having the remaining thickness (i.e., 2 Å thick). It is also contemplated that, in some embodiments, the interfacial material may be provided within a magnetic layer adjacent to the coupling region 30 (i.e., magnetic layer 110g and/or magnetic layer 110v). For example, in some embodiments, a 4 Å thick magnetic layer 110g (and/or magnetic layer 110v) made of cobalt may be replaced with, for example, a 3-layer stack comprising (approximately) 1.5 Å of Co, 1 Å of the interfacial material, and 1.5 Å of Co. It should be noted that the specific thicknesses discussed above are only exemplary.

It should be noted that, although FIGS. 4 and 5 illustrate distinct interfacial layers (130a, 130b, 132a, 132b) formed at the interface of two layers, this is only exemplary. As a person of ordinary skill in the art would recognize, in some cases, after formation of magnetoresistive stack 100, the interfacial layer may not be visible (e.g., in a cross-section of ferromagnetic regions 122, 132) due to diffusion and cross-migration of materials in the multi-material stack (e.g., during subsequent processing). However, in some cases, compositional analysis (e.g., by energy-dispersive X-ray spectroscopy, etc.) may reveal the presence of the interfacial materials that forms the interfacial region between the magnetic and metal layers 110, 120 of ferromagnetic regions 122, 132.

In magnetoresistive stack 100 of FIG. 1, "fixed" region 20, intermediate region 50, and "free" region 60 may together form a magnetic tunnel junction (or MTJ) having an MR and an RA. To determine the effect of the above-described surface treatment on these parameters (MR, RA, etc.) and other relevant parameters of an MTJ, experimental evaluations were conducted on multiple exemplary MTJ test samples. These MTJ test samples had a "fixed" region 20 with two ferromagnetic regions 122 and 132 (having the configuration illustrated in FIGS. 2 and 3, respectively) coupled together with a ruthenium (Ru) coupling region 30, and an intermediate region 50 (i.e., tunnel barrier) of magnesium oxide (MgOx). Further, the various magnetic and metal layers 110 and 120, respectively, of these test samples were made of cobalt (Co) and platinum (Pt) (with each layer approximately 3 Å thick), respectively. Selected metal layers 120 of some of the test samples were surface treated (with different conditions of surface treatment) and the metal layers of other test samples were not surface treated and used as baseline samples. Results from these evaluations indicate that the performance of the MTJs that were subject to surface treatment were at least as good as, and in some cases better than, MTJs which were not subject to surface treatment (i.e., baseline samples).

Figure 6A:
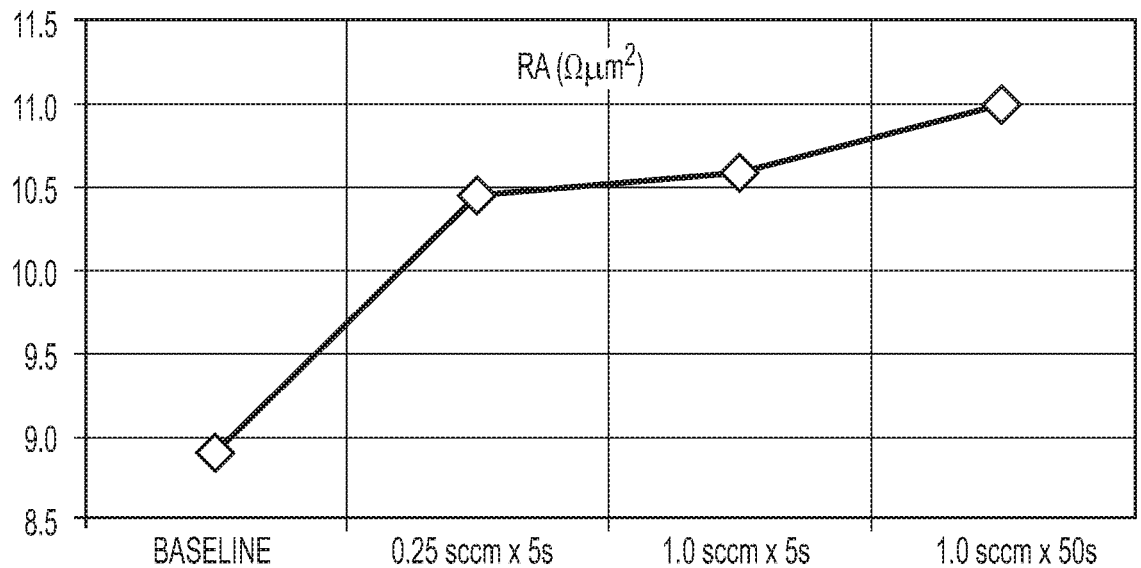
Figure 6B:
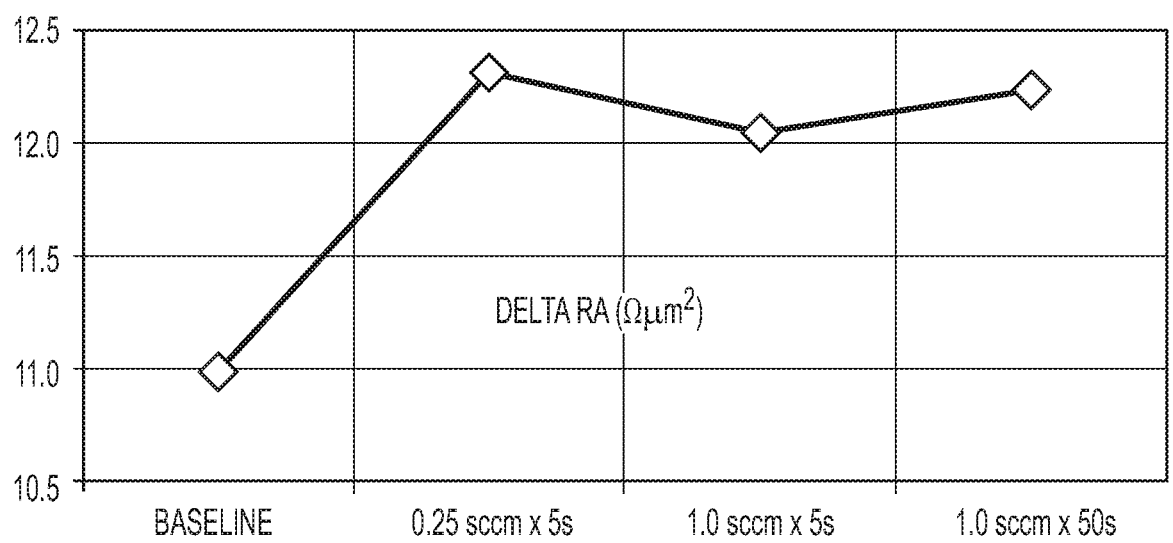
Figure 6C:
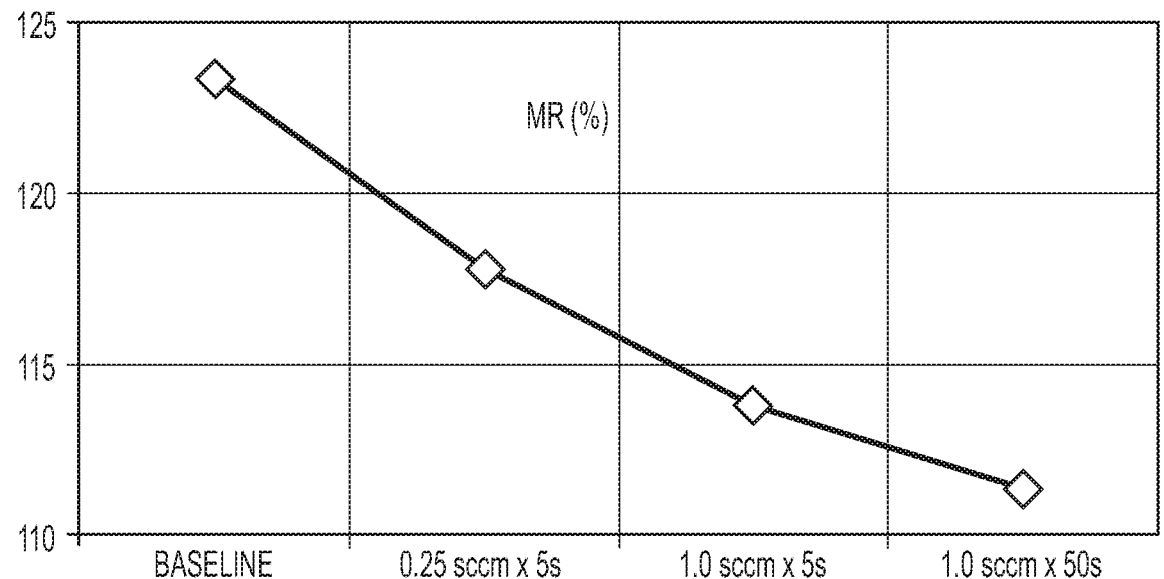
Figure 6D:
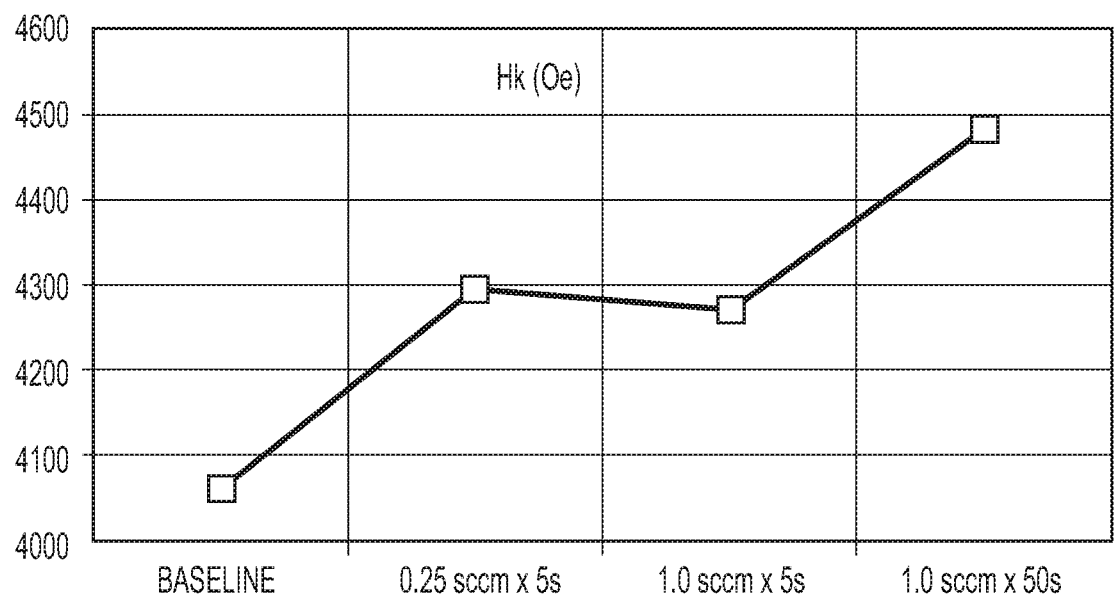
Figure 6E:
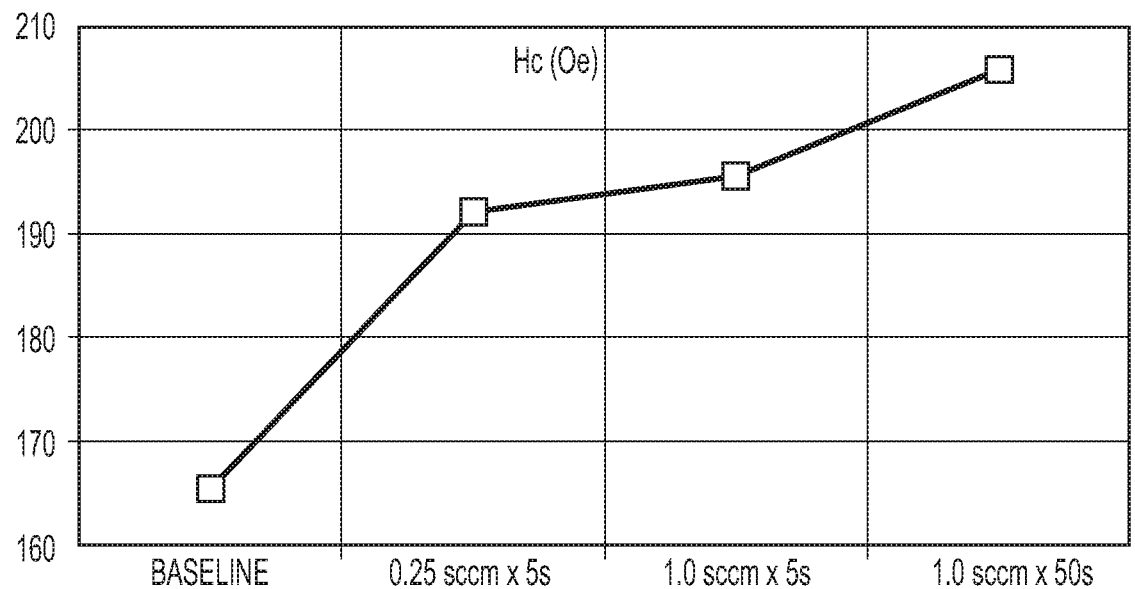
Figure 6F:
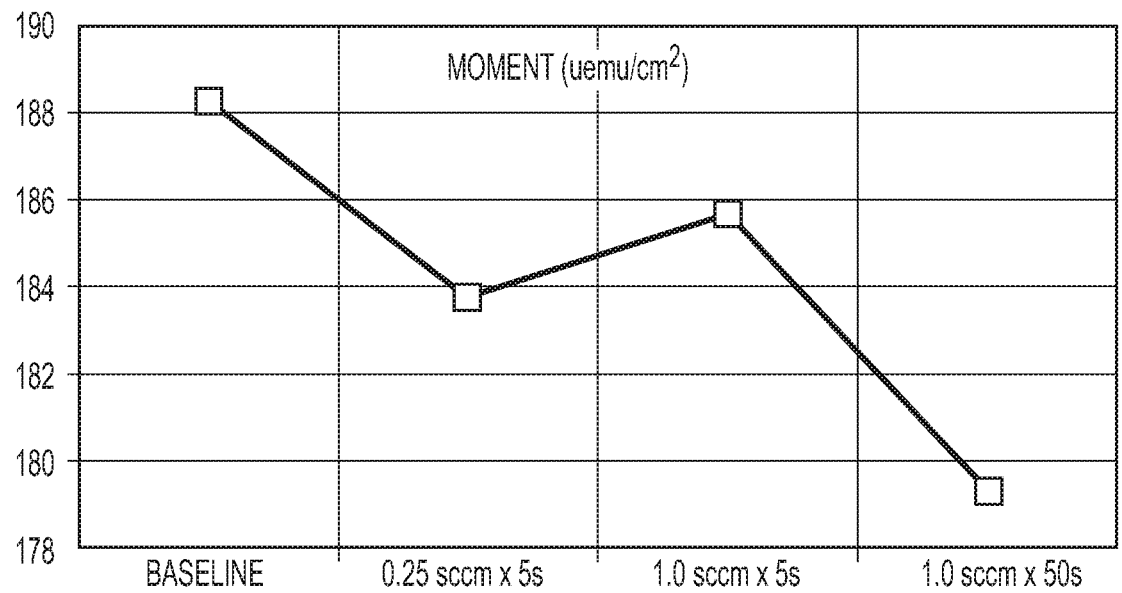
Figure 6G:
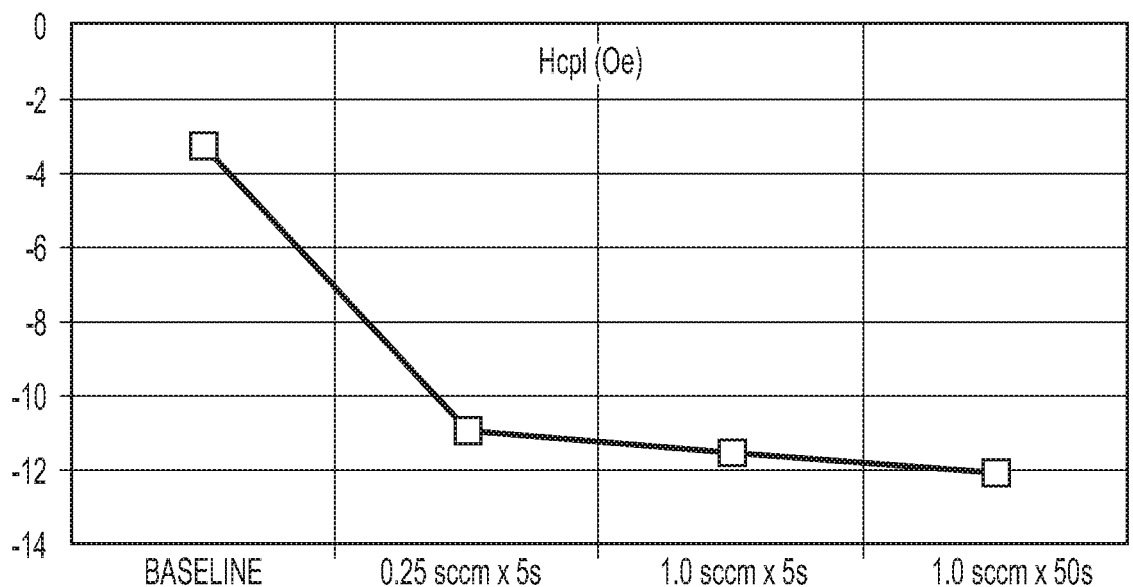

FIGS. 6A-6C compares the RA, delta RA (i.e., change in resistance times area) and MR, of the test samples with and without surface treatment (i.e., baseline samples). In the surface treated samples, only metal layer 120y of ferromagnetic region 132 (see FIG. 3) was surface treated by exposing the surface to different conditions of oxygen exposure (e.g., 0.25 sccm for 5 seconds, 1 sccm for 5 seconds, and 1 sccm for 50 seconds). As evident from these figures, the oxygen surface treatment results in an increase in RA and a decrease in MR as the surface treatment dose increases. It is believed that the increase in RA is due to improved tunnel barrier performance stemming from the oxidation of the treated metal layer 120y. Magnetoresistance change (delta RA) also increased with surface treatment, further indicating that the tunnel barrier is improved, and thereby the entire MTJ. The increase in RA and delta RA is believed to be due to a smoother intermediate region 50 (which in this case was a magnesium oxide (MgOx) tunnel barrier) and an improved interface of the tunnel barrier with "fixed" region 20. It is believed that such increases in RA and delta RA may improve TDDB and spin-transfer torque (STT) switching efficiency of a magnetoresistive device. Although these results indicate the results with exposure to oxygen, it is believed that similar benefits may be achieved with exposure to other gases or a mixture of other gases, which may or may not include oxygen.

FIGS. 6D-6G compare the magnetic properties (perpendicular anisotropy field $H_K$, coercivity $H_C$, magnetic moment, and coupling field $H_{CPL}$) of free layer for the MTJ test samples (that is, the same test samples described with reference to FIGS. 6A-6C) with and without surface treatment. As can be seen in these figures, the surface treated samples showed increased Hk, $H_C$ and coupling field $H_{CPL}$ (coupling field between "fixed" region 20 and "free" region 60) compared to samples (i.e., those identified as "baseline") that were not surface treated. The improvements in these properties are believed to be due to surface treatment of metal layer 120y (of ferromagnetic region 132). Although the results indicate that magnetic moment decreased as a result of the surface treatment, the change in magnetic moment is not considered to be significant. Therefore, the surface treatment may not cause a significant change in $H_K$ and magnetic moment (of "free" region 60).

FIG. 7 shows a portion of major M-H loops (magnetization (in unit of emu) versus magnetic field (in unit of Oe) hysteresis loop) of the above-described test samples with and without surface treatment. As would be recognized by a person of ordinary skill in the art, the right curves (i.e., positioned at approximately 7500 oersted and indicated by "A") in FIG. 7 are indicative of AP1 switching and the left curves (i.e., positioned at approximately 4300 oersted and indicated by "B") are indicative of AP2 and reference layer (region 132 and 36) switching. These results (i.e., the similarities of the curves in FIG. 7) indicate that there is substantially no change in AP1 switching and AP2 switching as a result of the surface treatment. This further indicates that there is substantially no PMA or exchange coupling changes due to the surface treatment of the second metal layer 120y of ferromagnetic region 132. The results of FIGS. 6A-7 indicate that surface treatment of metal layer 120y (of ferromagnetic region 132), may result in improved tunneling magnetoresistance (delta RA) and TDDB performance and/or endurance/reliability without any adverse effects.

To evaluate the effect of surface treating different metal layers 120 of an MTJ stack, experimental evaluations were conducted on test samples where different metal layers 120 of the samples were treated by exposing the layer to oxygen at 1 sccm for 50 seconds. FIGS. 8A-8C compare the RA, delta RA and MR, of the test samples. In FIGS. 8A-8C, the x-axis indicates the metal layer 120 (of ferromagnetic region 132 (i.e., AP2) or first ferromagnetic region 122 (i.e., AP1)) that was surface treated. As can be seen from these figures, increase in RA and delta RA (compared to the baseline sample) are observed when a metal layer 120 of AP2 (i.e., of ferromagnetic region 132) is surface treated, and the increase is larger when the treated surface is closer to the interface with intermediate region 50 (see FIG. 1). These results also indicate that there is no significant impact on MR, RA, and delta RA when a metal layer 120 of AP1 (i.e., of ferromagnetic region 122) is surface treated.

FIGS. 9A-9D compare the magnetic properties ($H_K$, $H_C$, magnetic moment, and $H_{CPL}$) of the MTJ test samples (same test samples described with reference to FIGS. 8A-8C). As can be seen in these figures, $H_C$ and $H_{CPL}$ changes significantly when the treated surface (of metal layer 120) is closer to the interface with intermediate region 50. And, there are no significant effects of the surface treatment in magnetic moment and Hk of "free" region 60.

FIG. 10A shows a portion of the major M-H loops of test samples where different metal layers 120 (metal layers 120v-120y, $1^{st}$, $2^{nd}$, $3^{rd}$, and $4^{th}$ in FIG. 3) of ferromagnetic region 132 (i.e., AP2) were surface treated by exposing the layer to oxygen at 1 sccm for 50 seconds. And, FIG. 10B shows a portion of the major M-H loops of test samples where metal layers 120b, 120d, and 120f ($6^{th}$, $4^{th}$ and $2^{nd}$ in FIG. 2) of ferromagnetic region 122 (i.e., AP1) were surface treated. The M-H loop of the baseline sample is also included in FIGS. 10A and 10B for comparison. As explained previously, in FIGS. 10A and 10B, the right curves (i.e., positioned between 7400 and 8800 oersted and indicated by the arrow "A") are indicative of AP1 switching and the left curves (i.e., positioned between 4000 and 5000 oersted and indicated by the arrow "B") are indicative of AP2 and reference layer (region 132 and 36 in FIG. 1) switching. These figures indicate that, as compared to the baseline sample, slightly lower PMA and/or exchange coupling is observed when a metal layer 120 of AP2 is surface treated, and slightly higher PMA and/or exchange coupling is observed when metal layers 120d, or 120f of AP1 is surface treated. Slightly lower PMA and/or exchange coupling is observed when metal layer 120b ($2^{nd}$ in FIG. 2) is surface treated. However, overall there are no significant changes in PMA and exchange coupling in the surface treated samples compares to the baseline sample.

Figure 11A:
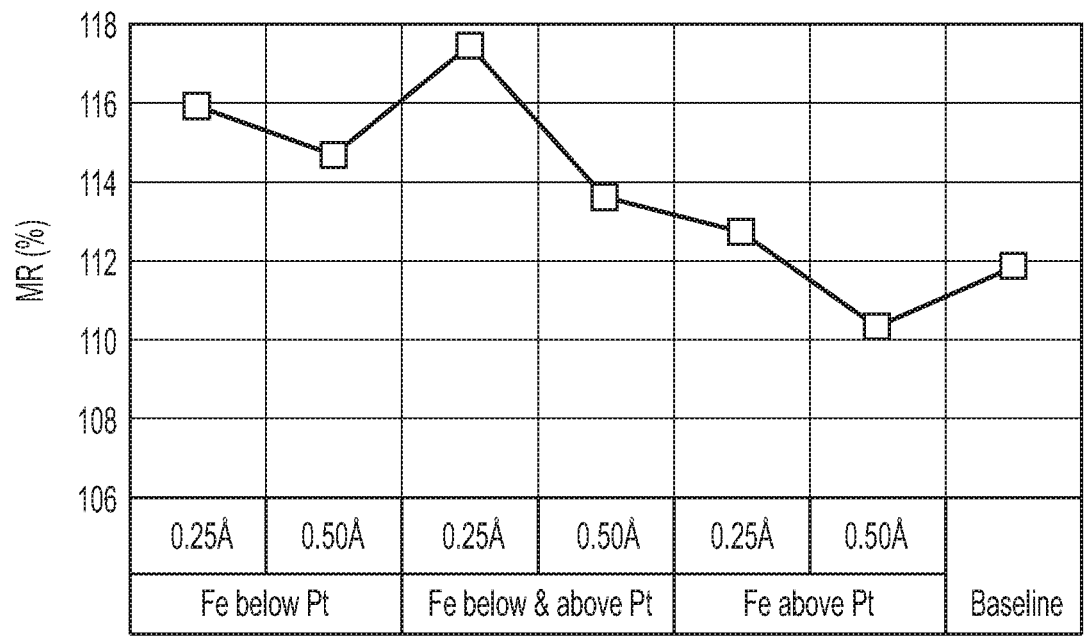
Figure 11B:
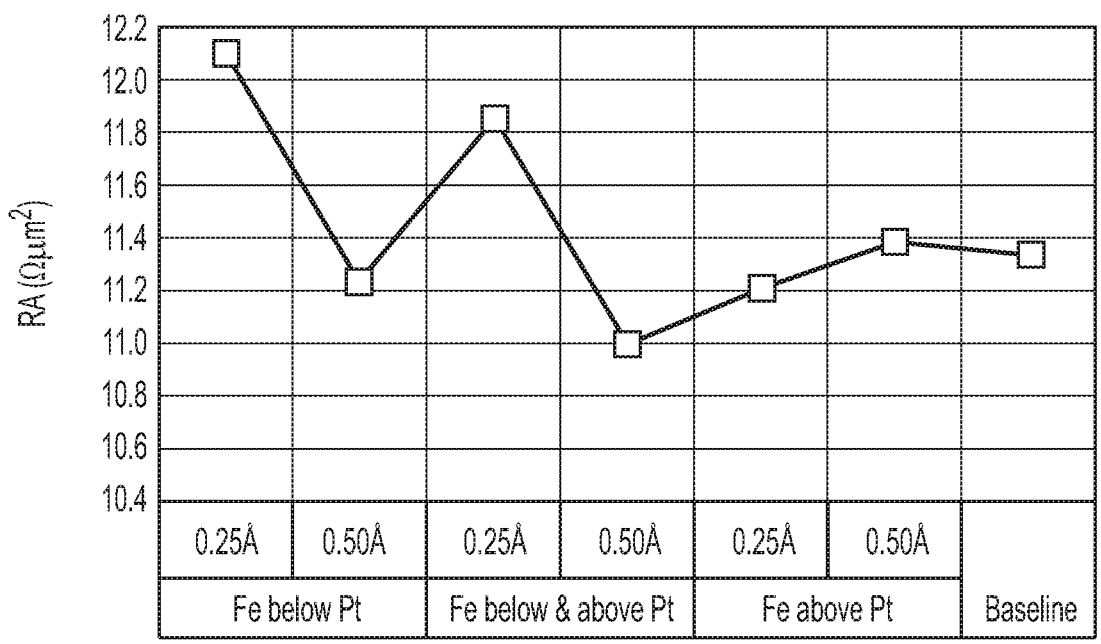
Figure 11C:
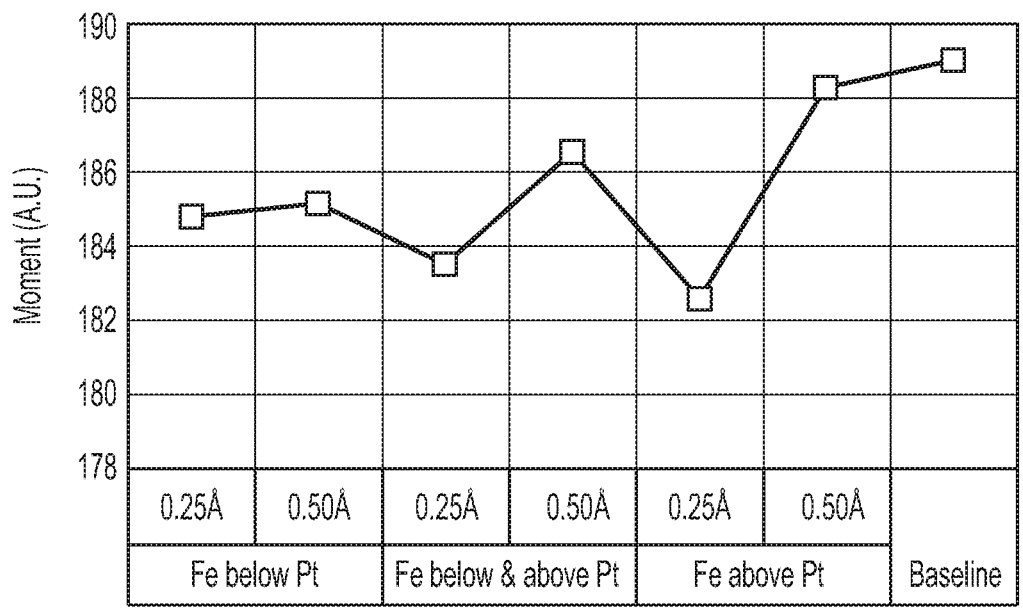
Figure 11D:
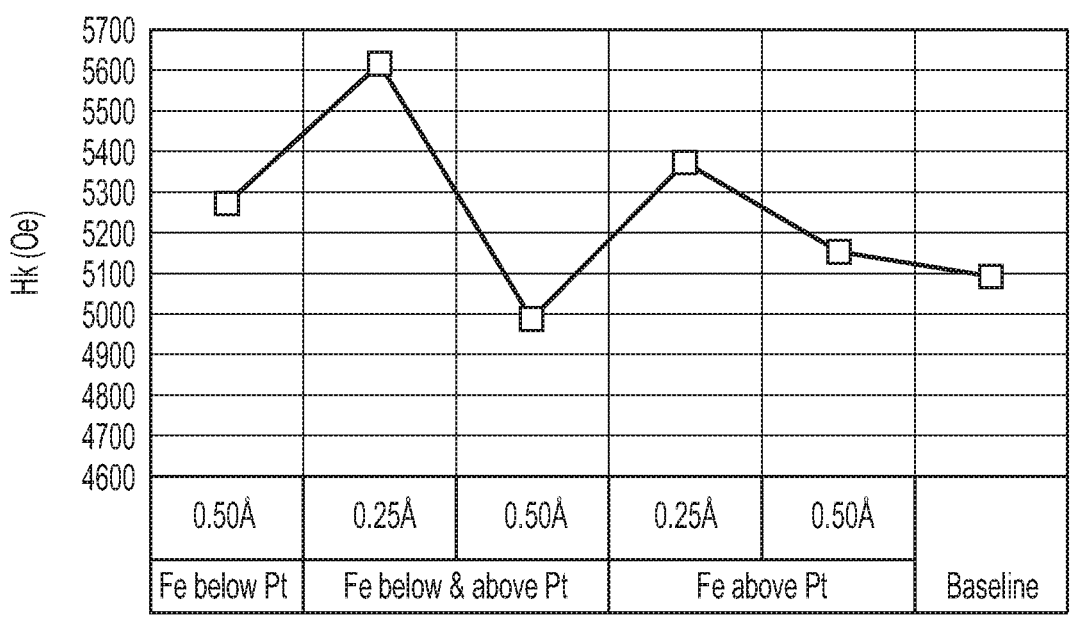

FIGS. 11A and 11B compare MR and RA of the test samples with an interface layer 130a or 130b to a baseline sample without an interface layer. With reference to FIG. 5, some test samples included an interfacial layer 130a below all metal layers 120a-120y (of ferromagnetic regions 122, 132), some test samples included an interfacial layer 130b above all metal layers 120a-120y, and some test samples had interfacial layers 130a, 130b above and below all metal layers 120a-120y. In all cases, the interface layer 130a and/or 130b was formed of iron (Fe). Two thicknesses, approximately 0.25 Å and approximately 0.5 Å, of interfacial layers were studied. As would be recognized by a person of ordinary skill in the art, a layer of material that is approximately 0.25 Å and approximately 0.5 Å thick will form a dusting at the interface (i.e., a non-continuous layer) as opposed to a continuous layer. The X-axis of FIGS. 11A and 11B identify the configuration of the interfacial layer corresponding to the plotted result. As evident from these figures, in some cases, the presence of the interfacial layer has a relatively low impact on MR and RA. In some cases, the presence of an interfacial layer increases the RA. It is believed that the increase in RA is due to improved tunnel barrier performance stemming from the interfacial layer. FIGS. 11C and 11D compare the magnetic properties (magnetic moment and perpendicular anisotropy field $H_K$) of free region of the test samples of FIGS. 11A and 11B with the baseline. The results of FIGS. 11C and 11D indicate that the performance of the "free" region 60 is relatively unaffected by the presence of the interfacial layers in the "fixed" region 20. The interfacial layers in the "fixed region" has potential to improve tunnel barrier quality (for example, less defect or pinhole).

FIGS. 12A and 12B shows a portion of major M-H loops of the above-described test samples with and without interfacial layers described herein. FIG. 12A shows the results for an approximately 0.25 Å thick interfacial layer (formed of iron), and FIG. 12B shows the results for an approximately 0.5 Å thick interfacial layer. As explained with reference to FIG. 7, the curves on the right (i.e., positioned between approximately 6000-8000 Oersted) in FIGS. 12A and 12B are indicative of AP1 switching and the curves on the left (i.e., positioned between approximately 4000-4500 Oersted) are indicative of AP2 and reference layer (region 132 and 36) switching. These results indicate that all evaluated configurations of interfacial layers affected exchange coupling strength and/or PMA of AP1 (122) and AP2 (132) similarly. And, in general, samples with an interfacial layer showed a slightly lower AP1 switching field and less square AP2 loops as compared to the baseline sample. It is expected that the AP2 and reference layers switching may become sharper (i.e. square M-H loops) if an interfacial layer is only provided on ferromagnetic region 122 (AP1).

FIG. 12C compares the major M-H loops of test samples with an interfacial layer provided adjacent to coupling region 30 (i.e., in magnetic regions 110g and/or 110v of FIG. 5) with a baseline sample. In all test samples, the coupling region 30 included an approximately 4 Å thick layer of ruthenium (Ru). With reference to FIGS. 5 and 12C, the baseline sample (marked P) has: an approximately 4 Å thick cobalt (Co) layer as magnetic layer 110g; an approximately 4 Å thick ruthenium (Ru) layer as coupling region 30; and an approximately 4 Å thick cobalt (Co) layer as magnetic layer 110v. Such as configuration is indicated in FIG. 12C as Co4/Ru4/Co4. The sample marked Q has: a magnetic layer 110g consisting of approximately 1 Å iron (Fe) and approximately 3 Å cobalt (Co); a coupling region 30 of an approximately 4 Å ruthenium (Ru); and a magnetic layer 110v of approximately 1 Å iron (Fe) and approximately 3 Å cobalt (Co). This configuration is indicated in FIG. 12C as Fe1/Co3/Ru4/Co3/Fe1. The sample marked R has: a magnetic layer 110g consisting of approximately 1.75 Å cobalt (Co), approximately 0.5 Å iron (Fe), and approximately 1.75 Å cobalt (Co); a coupling region 30 of an approximately 4 Å ruthenium (Ru); and a magnetic layer 110v consisting of approximately 1.75 Å cobalt (Co), approximately 0.5 Å iron (Fe), and approximately 1.75 Å cobalt (Co). This configuration is indicated in FIG. 12C as Co1.75/Fe0.5/Co1.75/Ru4/Co1.75/Fe0.5/Co1.75. Other configurations of test samples (S-W) are indicated in a similar manner. The results of FIG. 12C indicates that AP1 and AP2 switching and exchange coupling strength and/or PAM of AP1 and AP2 are increased (as compared to the baseline case) when an interfacial layer of iron (Fe) or iron-cobalt (CoFe) is provided adjacent to coupling region 30.

MTJ devices (formed using stacks 100) may include a sensor architecture or a memory architecture (among other architectures). For example, in an MTJ device having a memory configuration, the MTJs may be electrically connected to an access transistor and configured to couple or connect to various conductors, which may carry one or more control signals, as shown in FIG. 13. The MTJ devices may be used in any suitable application, including, e.g., in a memory configuration. In such instances, the MTJ devices may be formed as integrated circuits comprising a discrete memory device (e.g., as shown in FIG. 14A) or an embedded memory device having a logic therein (e.g., as shown in FIG. 14B), each including MRAM, which, in one embodiment, is representative of one or more arrays of MRAM having a plurality of magnetoresistive stacks/structures, according to certain aspects of certain embodiments disclosed herein.

Exemplary methods of fabricating selected embodiments of the disclosed magnetoresistive stack 100 will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 15 depicts a flow chart of an exemplary method 200 of fabricating magnetoresistive stack/structure 100. In the discussion below, reference will be made to FIGS. 1-3. A first electrode (e.g., bottom electrode 10) may be formed by any suitable process, including, e.g., deposition (step 210). In some embodiments, electrode 10 may be formed on a surface of a substrate that defines a plane. A seed region 12 may then be formed on or above electrode 10 (step 220). A "fixed" region 20 then may be formed on or above electrode 10. Forming "fixed" region 20 may include forming (e.g., by depositing) a first ferromagnetic region 122 on or above seed region 12 (step 230). A coupling region 30 may then be formed on or above region 122 (step 240). A second ferromagnetic region 132 may then be formed on or above coupling region 30 (step 250). A transition region 34 and a reference region 36 may then be sequentially formed on or above second ferromagnetic region 132 (step 260). An intermediate region 50 then may be formed on or above region 36 (step 270), and a "free" region 60 may be formed on or above the intermediate region 50 (step 280). Then, a second intermediate region 70, a spacer region 82, a capping region 86, and a second electrode 90 may be sequentially formed atop the second intermediate region 70 (step 290).

FIG. 16A is a flow chart of an exemplary method 300 of forming one or both of ferromagnetic regions 122 and 132 (i.e., steps 230 and 250). A magnetic layer 110 is first formed (step 310). When ferromagnetic region 122 is being formed, the magnetic layer 110 in step 310 is formed on or above an exposed surface of seed region 12, and when ferromagnetic region 132 is being formed, the magnetic layer 110 in step 310 is formed on or above an exposed surface of coupling region 30. A metal layer 120 is then formed on a surface of the magnetic layer 110 (step 320). An exposed surface of the formed metal layer 120 (in step 320) may then be treated by exposing the surface to oxygen gas (substantially pure oxygen or a mixture of oxygen with other gases (e.g., 2-80% oxygen in nitrogen)) for a duration of approximately 5-100 seconds (step 330). In some embodiments, the gas may have a flow rate of approximately 0.25-10 sccm (standard cubic centimeters per minute) and a pressure of approximately 0.01-10 mTorr. In some embodiments, steps 310, 320, and 330 may then be repeated to form multiple pairs of magnetic and metal layers 110, 120. That is, after treating the surface of the metal layer 120 formed in step 320, another magnetic layer 110 and another metal layer 120 may be sequentially formed on the treated surface. In some embodiments, the exposed surface of the another metal layer 120 may also be surface treated. After the desired number or magnetic and metal layer pairs are formed, a magnetic layer 110 may then be formed on the treated surface of the last metal layer 120 (step 340).

In some embodiments, surface treatment (i.e., step 330) may not be performed on the second metal layer 120 of every pair of first and second magnetic layers 110, 120. Instead, the surface treatment may only be performed on selected second metal layers 120. For example, in some embodiments, surface treatment (i.e., step 330) may only be performed on the outermost (or top most or final) second metal layer 120 of the magnetic layer pairs. In some embodiments, surface treatment may also be (or alternatively be) performed on other second metal layers 120 of the alternating first and second magnetic layers.

FIG. 16B is a flow chart of another exemplary method 400 of forming one or both of ferromagnetic regions 122 and 132 (i.e., steps 230 and 250 of FIG. 15). As described with reference to FIG. 16A, a magnetic layer 110 is first formed (step 410). In some embodiments, an interfacial layer 130*a* may be formed on the magnetic layer 110 (step 420). The interfacial layer 130*a* may be a dusting of material on the surface of magnetic layer 110. A metal layer 120 is then formed on the interfacial layer 130*a* (step 430). Additionally or alternatively (to step 420), in some embodiments, an interfacial layer 130*b* may also be formed on the metal layer 120 (step 440). Steps 410-440 may then be repeated to form multiple pairs of magnetic and metal layers 110, 120. After the desired number or magnetic and metal layer pairs 110, 120 are formed, a final magnetic layer 110 is formed on the surface of the last metal layer 120 (step 450). Coupling region 30 may then be formed above the final magnetic layer (step 460). In some embodiments, an interfacial layer 132*a* may be formed on the magnetic layer 110, and the coupling region 30 may be formed on the interfacial layer 132*a* (step 455). Ferromagnetic region 132 may then be formed above the coupling region (step 470). In some embodiments, an interfacial layer 132*b* may be formed on the coupling region and the ferromagnetic region 132 may be formed on the interfacial region 132*b* (step 465). In some embodiments, ferromagnetic region 132 may be formed (i.e., step 470) using steps 410-450.

Any suitable process may be used to form the different regions of magnetoresistive stack 100 (such as, for example, ferromagnetic regions 122 and 132). In some embodiments, forming the different layers (e.g., first and second magnetic layers 110 and 120, interfacial layers 130*a*, 130*b*, 132*a*, 132*b*) of ferromagnetic regions 122 and 132 may include depositing the material of the layer by, for example, physical vapor deposition (e.g., ion beam sputtering, magnetron sputtering, etc.), chemical vapor deposition, plasma-enhanced chemical vapor deposition, etc. Formation of some or all of the regions may also involve known processing steps such as, for example, selective deposition, photolithography processing, etching, annealing, etc., in accordance with any of the various conventional techniques known in the semiconductor industry. In some embodiments, during deposition, a magnetic field may be applied to set a preferred easy magnetic axis of the region (e.g., via induced anisotropy). Similarly, a strong magnetic field applied during the post-deposition high-temperature anneal step may be used to induce a preferred easy magnetic axis and a preferred pinning direction for any antiferromagnetically pinned materials or exchange coupled pinning materials. Since these techniques are known to those of ordinary skill in the art, they are not described here in greater detail.

In some embodiments, magnetoresistive stack 100 may be fabricated by depositing each succeeding region directly on a surface of the region below. For instance, with reference to FIG. 1, in some embodiments, ferromagnetic region 122 may be formed directly on a surface of seed region 12, and so forth. Any suitable method may be used to form the different regions or layers. Since suitable integrated circuit fabrication techniques (e.g., deposition, sputtering, evaporation, plating, etc.) that may be used to form the different layers are known to those of ordinary skill in the art, they are not described here in great detail. In some embodiments, forming some of the layers may involve thin-film deposition processes, including, but not limited to, physical vapor deposition techniques such as ion beam sputtering and magnetron sputtering. And, forming thin insulating layers, such as the tunnel barrier layers, may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to oxygen environment.

In some embodiments, a magnetoresistive device is disclosed. The device includes an intermediate region including a dielectric material, a magnetically free region on one side of the intermediate region, and a magnetically fixed region on a side of the intermediate region opposite to the magnetically free region. The magnetically fixed region may include at least two ferromagnetic regions coupled together by an antiferromagnetic coupling region. At least one of the two ferromagnetic regions may include multiple alternating metal layers and magnetic layers and one or more interfacial layers. Each metal layer may include at least one of platinum, palladium, nickel, or gold, and the one or more interfacial layers may include at least one of an oxide, iron, or an alloy including cobalt and iron.

Various embodiments of the disclosed device may alternatively or additionally include one or more of the following aspects: each magnetic layer includes one of cobalt, or a cobalt based alloy; each magnetic layer includes cobalt; the one or more interfacial layers includes an oxide of a material of the metal layer; the one or more interfacial layers includes iron, iron-based alloy, cobalt-based alloy, or a cobalt-iron alloy; at least one interfacial layer of the one or more interfacial layers is positioned at an interface of a metal layer and a magnetic layer; at least one interfacial layer of the one or more interfacial layers is positioned within a magnetic layer; a thickness of each magnetic layer and each metal layer is between approximately 2-6 Å, and a thickness of at least one interfacial layer of the one or more interfacial layers is less than or equal to approximately 1 Å; both ferromagnetic regions of the at least two ferromagnetic regions include multiple alternating metal layers and magnetic layers, and wherein each magnetic layer includes cobalt; and the antiferromagnetic coupling region includes ruthenium, and at least one interfacial layer of the one or more interfacial layers is positioned at an interface of the antiferromagnetic coupling region with at least one of the two ferromagnetic regions, and wherein the at least one interfacial layer includes iron, iron-based alloy, cobalt-based alloy or a cobalt-iron alloy and has a thickness less than or equal to approximately 5 Å.

In some embodiments, a method of forming a magnetoresistive device is disclosed. The method includes forming a magnetically free region on one side of a dielectric region, and forming a magnetically fixed region on a side of the dielectric region opposite to the magnetically free region. Forming the magnetically fixed region may include forming a first ferromagnetic region, forming a second ferromagnetic region, and forming an antiferromagnetic coupling region between the first and the second ferromagnetic regions. Forming the first ferromagnetic region and/or forming the second ferromagnetic region may include forming multiple alternating metal layers and magnetic layers and forming one or more interfacial layers. Each metal layer may include at least one of platinum, palladium, nickel, or gold, and the one or more interfacial layers may include at least one of an oxide, iron, or an alloy including cobalt and/or iron.

Various embodiments of the disclosed method may alternatively or additionally include one or more of the following aspects: forming the first ferromagnetic region and/or forming the second ferromagnetic region may include: forming a metal layer, oxidizing a surface of the metal layer to form an oxide interfacial layer of the one or more interfacial layers, and forming a magnetic layer above the oxide interfacial layer; forming the first ferromagnetic region and/or forming the second ferromagnetic region may include: forming a metal layer, exposing a first surface of the metal layer to a flow of oxygen, at a flow rate of approximately 0.25-10 sccm, at a pressure of approximately 0.01-10 mTorr, for a duration of approximately 5-100 seconds, to form an oxide interfacial layer of the one or more interfacial layers, and after the exposing, forming a magnetic layer above the oxide interfacial layer; forming the first ferromagnetic region and/or forming the second ferromagnetic region may include: forming a metal layer, depositing one of iron, iron-based alloy, cobalt-based alloy, or a cobalt-iron alloy on a surface of the metal layer to form an interfacial layer of the one or more interfacial layers, and forming a magnetic layer above the interfacial layer; forming the first ferromagnetic region and/or forming the second ferromagnetic region may include: forming a magnetic layer, depositing one of iron, iron-based alloy, cobalt-based alloy, or a cobalt-iron alloy on a surface of the magnetic layer to form an interfacial layer of the one or more interfacial layers, and forming a metal layer above the interfacial layer; the one or more interfacial layers may include at least a first interfacial layer and a second interfacial layer, and forming the first ferromagnetic region and/or forming the second ferromagnetic region may include: forming a first magnetic layer, depositing one of iron, iron-based alloy, cobalt-based alloy, or a cobalt-iron alloy on a surface of the first magnetic layer to form the first interfacial layer, forming a metal layer above the first interfacial layer, depositing one of iron, iron-based alloy, cobalt based alloy or a cobalt-iron alloy on a surface of the metal layer to form the second interfacial layer, and forming a second magnetic layer above the second interfacial layer; forming the first ferromagnetic region and/or forming the second ferromagnetic region may include forming a magnetic layer having a thickness between approximately 1.5-6 Å, forming a metal layer having a thickness between approximately 1.5-6 Å, forming one or more interfacial layers, having a thickness less than or equal to approximately 1 Å, above and/or below the metal layer; forming one or more interfacial layers may include forming an interfacial layer at an interface between the antiferromagnetic coupling region and at least one of the first and second ferromagnetic regions; forming one or more interfacial layers may include forming an interfacial layer at an interface between the antiferromagnetic coupling region and at least one of the first and second ferromagnetic regions, and wherein (a) the antiferromagnetic coupling region includes ruthenium, (b) the interfacial layer includes one of iron, iron-based alloy, cobalt-based alloy or a cobalt-iron alloy, and (c) the interfacial layer has a thickness less than or equal to approximately 5 Å; and forming multiple alternating metal layers and magnetic layers includes forming at least four metal layer alternating with four magnetic layers, wherein each magnetic layer includes cobalt.

Although various embodiments of the present disclosure have been illustrated and described in detail, it will be readily apparent to those skilled in the art that various modifications may be made without departing from the present disclosure or from the scope of the appended claims.

What is claimed is:
1. A magnetoresistive device comprising:
an intermediate region including a dielectric material;
a magnetically free region on one side of the intermediate region; and
a magnetically fixed region on a side of the intermediate region opposite to the magnetically free region, the magnetically fixed region including at least two ferromagnetic regions coupled together by an antiferromagnetic coupling region, wherein at least one of the two ferromagnetic regions includes:
multiple alternating metal layers and magnetic layers, wherein each metal layer includes at least one of platinum, palladium, nickel, or gold; and
one or more interfacial layers including at least one of an oxide, iron, or an alloy including cobalt and iron.
2. The device of claim 1, wherein each magnetic layer includes one of cobalt, or a cobalt based alloy.
3. The device of claim 1, wherein each magnetic layer includes cobalt.
4. The device of claim 1, wherein the one or more interfacial layers includes an oxide of a material of the metal layer.
5. The device of claim 1, wherein the one or more interfacial layers includes iron, iron-based alloy, cobalt-based alloy, or a cobalt-iron alloy.
6. The device of claim 1, wherein at least one interfacial layer of the one or more interfacial layers is positioned at an interface of a metal layer and a magnetic layer.
7. The device of claim 1, wherein at least one interfacial layer of the one or more interfacial layers is positioned within a magnetic layer.
8. The device of claim 1, wherein a thickness of each magnetic layer and each metal layer is between approximately 2-6 Å, and a thickness of at least one interfacial layer of the one or more interfacial layers is less than or equal to approximately 1 Å.
9. The device of claim 1, wherein both ferromagnetic regions of the at least two ferromagnetic regions include multiple alternating metal layers and magnetic layers, and wherein each magnetic layer includes cobalt.
10. The device of claim 1, wherein the antiferromagnetic coupling region includes ruthenium, and at least one interfacial layer of the one or more interfacial layers is positioned at an interface of the antiferromagnetic coupling region with at least one of the two ferromagnetic regions, and wherein the at least one interfacial layer includes iron, iron-based alloy, cobalt-based alloy or a cobalt-iron alloy and has a thickness less than or equal to approximately 5 Å.
11. A method of forming a magnetoresistive device, comprising:
forming a magnetically free region on one side of a dielectric region; and
forming a magnetically fixed region on a side of the dielectric region opposite to the magnetically free region, wherein forming the magnetically fixed region includes:
forming a first ferromagnetic region;
forming a second ferromagnetic region; and
forming an antiferromagnetic coupling region between the first and the second ferromagnetic regions, wherein forming the first ferromagnetic region and/or forming the second ferromagnetic region includes:
forming multiple alternating metal layers and magnetic layers, wherein each metal layer includes at least one of platinum, palladium, nickel, or gold; and forming one or more interfacial layers, wherein the one or more interfacial layers include at least one of an oxide, iron, or an alloy including cobalt and/or iron.

12. The method of claim 11, wherein forming the first ferromagnetic region and/or forming the second ferromagnetic region includes:
   forming a metal layer;
   oxidizing a surface of the metal layer to form an oxide interfacial layer of the one or more interfacial layers; and
   forming a magnetic layer above the oxide interfacial layer.

13. The method of claim 11, wherein forming the first ferromagnetic region and/or forming the second ferromagnetic region includes:
   forming a metal layer;
   exposing a first surface of the metal layer to a flow of oxygen, at a flow rate of approximately 0.25-10 sccm, at a pressure of approximately 0.01-10 mTorr, for a duration of approximately 5-100 seconds, to form an oxide interfacial layer of the one or more interfacial layers; and
   after the exposing, forming a magnetic layer above the oxide interfacial layer.

14. The method of claim 11, wherein forming the first ferromagnetic region and/or forming the second ferromagnetic region includes:
   forming a metal layer;
   depositing one of iron, iron-based alloy, cobalt-based alloy, or a cobalt-iron alloy on a surface of the metal layer to form an interfacial layer of the one or more interfacial layers; and
   forming a magnetic layer above the interfacial layer.

15. The method of claim 11, wherein forming the first ferromagnetic region and/or forming the second ferromagnetic region includes:
   forming a magnetic layer;
   depositing one of iron, iron-based alloy, cobalt-based alloy, or a cobalt-iron alloy on a surface of the magnetic layer to form an interfacial layer of the one or more interfacial layers;
   forming a metal layer above the interfacial layer.

16. The method of claim 11, wherein the one or more interfacial layers includes at least a first interfacial layer and a second interfacial layer, and wherein forming the first ferromagnetic region and/or forming the second ferromagnetic region includes:
   forming a first magnetic layer;
   depositing one of iron, iron-based alloy, cobalt-based alloy, or a cobalt-iron alloy on a surface of the first magnetic layer to form the first interfacial layer;
   forming a metal layer above the first interfacial layer;
   depositing one of iron, iron-based alloy, cobalt based alloy or a cobalt-iron alloy on a surface of the metal layer to form the second interfacial layer; and
   forming a second magnetic layer above the second interfacial layer.

17. The method of claim 11, wherein forming the first ferromagnetic region and/or forming the second ferromagnetic region includes:
   forming a magnetic layer having a thickness between approximately 1.5-6 Å;
   forming a metal layer having a thickness between approximately 1.5-6 Å;
   forming one or more interfacial layers, having a thickness less than or equal to approximately 1 Å, above and/or below the metal layer.

18. The method of claim 11, wherein forming one or more interfacial layers includes forming an interfacial layer at an interface between the antiferromagnetic coupling region and at least one of the first and second ferromagnetic regions.

19. The method of claim 11, wherein forming one or more interfacial layers includes forming an interfacial layer at an interface between the antiferromagnetic coupling region and at least one of the first and second ferromagnetic regions, and wherein (a) the antiferromagnetic coupling region includes ruthenium, (b) the interfacial layer includes one of iron, iron-based alloy, cobalt-based alloy or a cobalt-iron alloy, and (c) the interfacial layer has a thickness less than or equal to approximately 5 Å.

20. The method of claim 11, wherein forming multiple alternating metal layers and magnetic layers includes forming at least four metal layer alternating with four magnetic layers, wherein each magnetic layer includes cobalt.

* * * * *